US011075153B2

(12) United States Patent
Kanbe

(10) Patent No.: US 11,075,153 B2
(45) Date of Patent: Jul. 27, 2021

(54) ELECTRONIC COMPONENT-INCORPORATING SUBSTRATE

(71) Applicant: SHINKO ELECTRIC INDUSTRIES CO., LTD., Nagano (JP)

(72) Inventor: Yoshihisa Kanbe, Nagano (JP)

(73) Assignee: SHINKO ELECTRIC INDUSTRIES CO., LTD.

( * ) Notice: Subject to any disclaimer, the term of this patent is extended or adjusted under 35 U.S.C. 154(b) by 0 days.

(21) Appl. No.: 16/589,861

(22) Filed: Oct. 1, 2019

(65) Prior Publication Data

US 2020/0111732 A1 Apr. 9, 2020

(30) Foreign Application Priority Data

Oct. 4, 2018 (JP) .............................. JP2018-189082

(51) Int. Cl.
*H01L 23/498* (2006.01)
*H01L 21/48* (2006.01)
*H01L 23/58* (2006.01)

(52) U.S. Cl.
CPC ...... *H01L 23/49838* (2013.01); *H01L 21/481* (2013.01); *H01L 21/4846* (2013.01); *H01L 23/58* (2013.01)

(58) Field of Classification Search
CPC ............. H01L 23/49838; H01L 21/481; H01L 21/4846; H01L 23/58; H01L 2924/15153
USPC ........................................................ 361/761
See application file for complete search history.

(56) References Cited

U.S. PATENT DOCUMENTS

| 2013/0249075 | A1* | 9/2013 | Tateiwa | .................. H01L 24/24 257/734 |
| 2015/0223318 | A1* | 8/2015 | Sakamoto | ............ H05K 1/0206 361/717 |
| 2016/0044789 | A1* | 2/2016 | Shimizu | ............... H05K 3/4694 174/251 |
| 2016/0141236 | A1* | 5/2016 | Kurita | ............... H01L 23/49822 361/761 |

(Continued)

FOREIGN PATENT DOCUMENTS

JP 2016122728 A 7/2016

*Primary Examiner* — Sherman Ng
(74) *Attorney, Agent, or Firm* — Tarolli, Sundheim, Covell & Tummino LLP

(57) ABSTRACT

An electronic component-incorporating substrate includes a metal mount portion and a first insulation layer. The mount portion includes a first accommodation portion recessed from the upper surface. The first insulation layer includes a second accommodation portion configured by an opening that exposes the first accommodation portion and partially exposes the upper surface of the mount portion located around the first accommodation portion. The electronic component-incorporating substrate further includes an electronic component mounted on the first accommodation portion and including a connection pad, a second insulation layer covering the first insulation layer, the electronic component, and the connection pad, a wiring layer formed on an upper surface of the second insulation layer and including a via wiring extending through the second insulation layer in a thickness-wise direction and a wiring pattern connected to the connection pad of the electronic component by the via wiring.

10 Claims, 13 Drawing Sheets

(56) References Cited

U.S. PATENT DOCUMENTS

2017/0256478 A1* 9/2017 Sakamoto ............ H01L 21/6835
2018/0158770 A1* 6/2018 Lin ....................... H01L 25/105

* cited by examiner

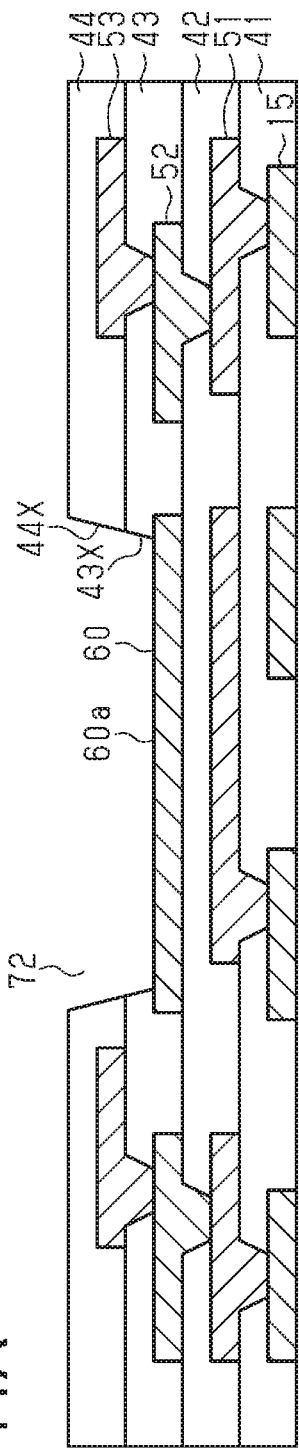
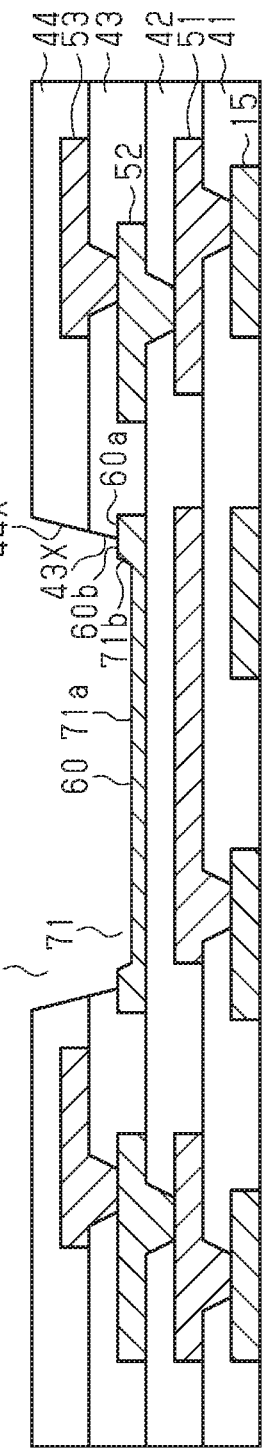

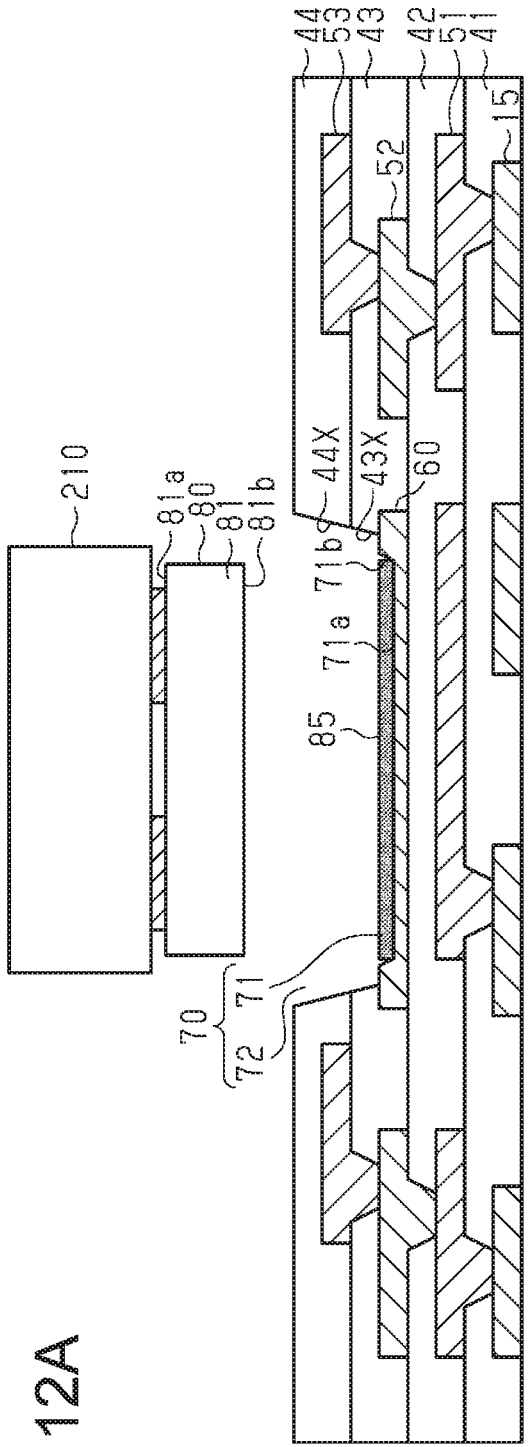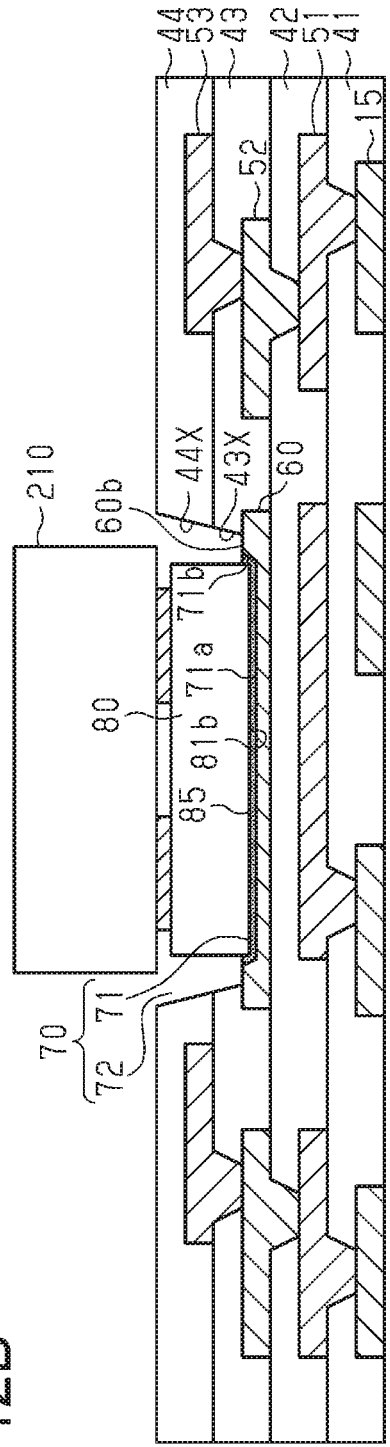

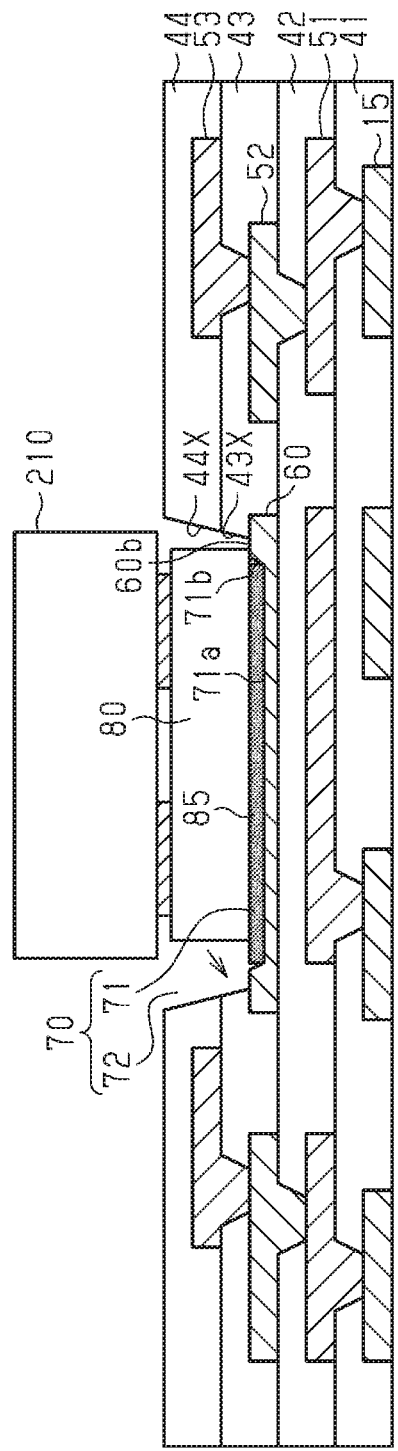
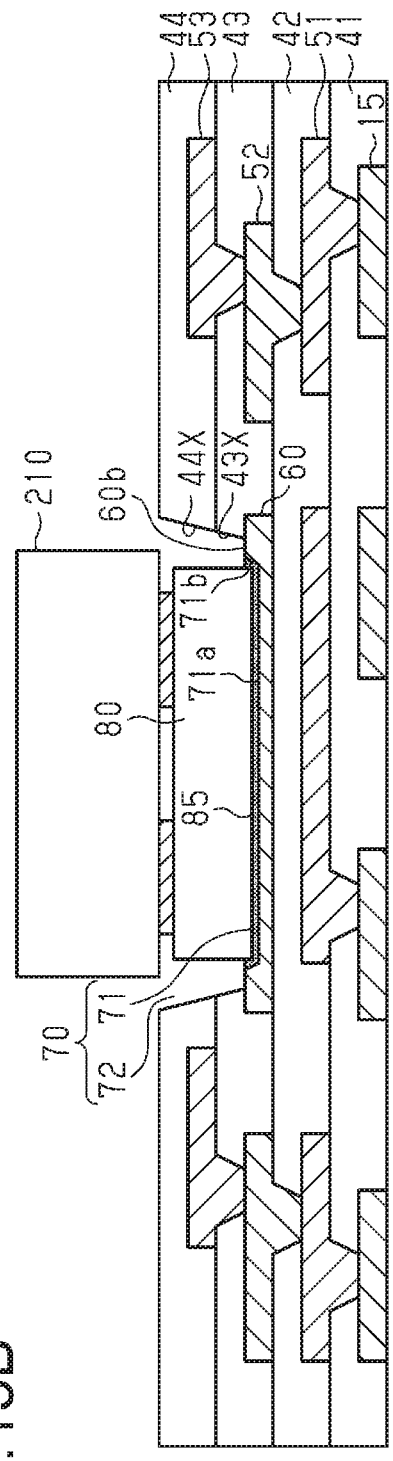

ELECTRONIC COMPONENT-INCORPORATING SUBSTRATE

CROSS-REFERENCE TO RELATED APPLICATIONS

This application is based upon and claims the benefit of priority from prior Japanese Patent Application No. 2018-189082, filed on Oct. 4, 2018, the entire contents of which are incorporated herein by reference.

FIELD

This disclosure relates to an electronic component-incorporating substrate.

BACKGROUND

Japanese Laid-Open Patent Publication No. 2016-122728 discloses a wiring substrate that incorporates an electronic component such as a semiconductor chip. In the wiring substrate described in the publication, a cavity is formed in an insulation layer, and the electronic component is mounted in the cavity and covered with and embedded into a further insulation layer. A via wiring extends through in the further insulation layer and connects a terminal of the electronic component to a wiring layer located on the upper surface of the further insulation layer.

When the electronic component mounted in the cavity is displaced, the connection reliability of the terminal of the electronic component with the via wiring may be lowered. Thus, displacement of an electronic component needs to be limited.

SUMMARY

One embodiment of an electronic component-incorporating substrate includes a mount portion formed of a metal, a first insulation layer, an electronic component, a second insulation layer, and a wiring layer. The mount portion includes a first accommodation portion recessed from an upper surface of the mount portion. The first insulation layer includes a second accommodation portion configured by an opening that exposes the first accommodation portion and partially exposes the upper surface of the mount portion located around the first accommodation portion. The electronic component is mounted on the first accommodation portion and includes a connection pad arranged on an upper surface of the electronic component. The second insulation layer covers the first insulation layer, the electronic component, and the connection pad. The second accommodation portion is filled with the second insulation layer. The wiring layer is formed on an upper surface of the second insulation layer. The wiring layer includes a via wiring that extends through the second insulation layer in a thickness-wise direction and a wiring pattern connected to the connection pad of the electronic component by the via wiring.

One embodiment of a method for manufacturing an electronic component-incorporating substrate includes forming a mount portion from a metal; forming a first insulation layer that covers the upper surface of the mount portion; forming an opening in the first insulation layer by irradiating an upper surface of the first insulation layer with a laser beam, the opening partially exposing the upper surface of the mount portion; forming a first accommodation portion recessed from the upper surface of the mount portion by irradiating the upper surface of the mount portion exposed in the opening of the first insulation layer with a laser beam, in which the first accommodation portion is smaller than a second accommodation portion defined by the opening in the first insulation layer, and the upper surface of the mount portion remaining around the first accommodation portion is exposed through the second accommodation portion; mounting an electronic component on the first accommodation portion, the electronic component including a connection pad arranged on an upper surface of the electronic component; forming a second insulation layer that covers the first insulation layer, the electronic component, and the connection pad; and forming a wiring layer on an upper surface of the second insulation layer, the wiring layer including a via wiring that extends through the second insulation layer in a thickness-wise direction and a wiring pattern connected to the connection pad of the electronic component by the via wiring.

Other embodiments and advantages thereof will become apparent from the following description, taken in conjunction with the accompanying drawings, illustrating by way of example the principles of the invention. It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 4A illustrates a state in which the electronic component is not displaced and FIGS. 4B and 4C illustrate a state in which the electronic component is displaced;

FIG. 5A illustrates a state in which the electronic component is not displaced and FIGS. 5B and 5C illustrate a state in which the electronic component is displaced;

FIGS. 10, 11A, 11B, 12A, 12B, 13A, 13B, 14, and 15 are schematic cross-sectional views illustrating manufacturing steps of the electronic component-incorporating substrate of FIG. 1;

DESCRIPTION OF THE EMBODIMENTS

Figure 1:
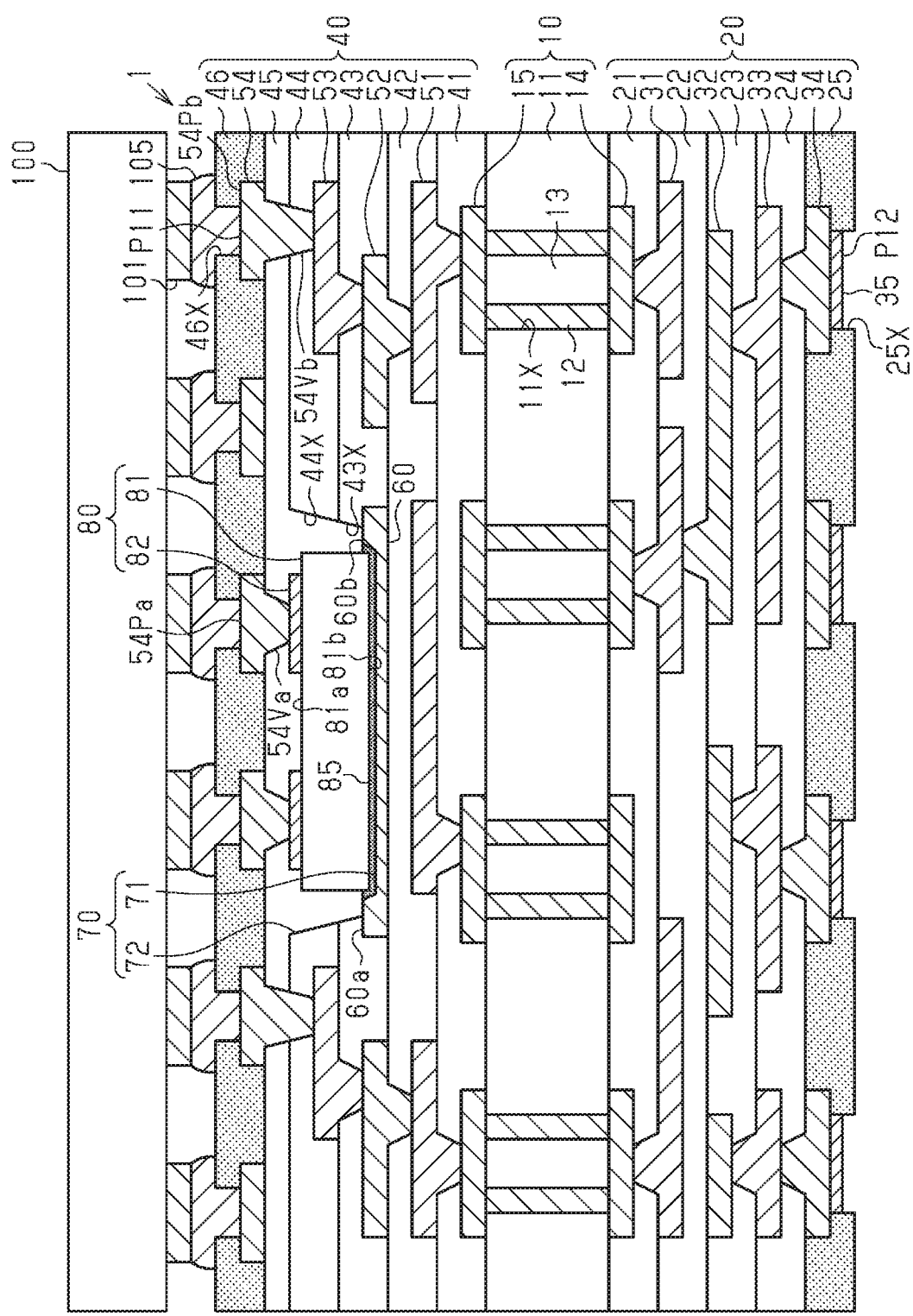
FIG. 1 is a schematic cross-sectional view of an electronic component-incorporating substrate in accordance with an embodiment.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings. In this specification, a plan view refers to a view of a subject taken in a vertical direction (e.g., upper-lower direction as viewed in FIG. 1).

FIG. 1 is a schematic cross-sectional view illustrating an example of an electronic component-incorporating substrate 1.

The electronic component-incorporating substrate 1 includes a substrate main body 10 located near the center of the electronic component-incorporating substrate 1 in the thickness-wise direction, a stacked body 20 formed on the lower surface of the substrate main body 10, and a stacked body 40 formed on the upper surface of the substrate main body 10. In the present example, the electronic component-incorporating substrate 1 includes an accommodation portion 70 in the stacked body 40, and the accommodation portion 70 incorporates an electronic component 80.

The substrate main body 10 includes a core substrate 11. The core substrate 11 includes through holes 11X extending through the core substrate 11 in the thickness-wise direction. Through electrodes 12 are located in the through holes 11X. Each through electrode 12 has an inner through hole filled with a resin material 13. Although the inner through holes of the through electrodes 12 are filled with the resin material 13 in this example, the through holes 11X may be filled with only the through electrodes 12. A wiring layer 14 is formed on the lower surface of the core substrate 11, and a wiring layer 15 is formed on the upper surface of the core substrate 11. The wiring layers 14 and 15 are connected to each other via the through electrodes 12.

The material of the core substrate 11 may be, for example, a glass epoxy resin obtained by impregnating a glass cloth (glass woven cloth), which is a reinforcement material, with a thermosetting insulative resin including epoxy resin as a main component and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to epoxy resin and may be, for example, a resin material such as polyimide resin or cyanate resin. The resin material 13 may be, for example, the same as the material of the core substrate 11. The resin material 13 may differ from the material of the core substrate 11. The material of the through electrodes 12 and the wiring layers 14 and 15 may be, for example, copper (Cu) or a copper alloy.

The stacked body 20 includes a plurality (four in FIG. 1) of insulation layers 21, 22, 23, and 24, a plurality (four in FIG. 1) of wiring layers 31, 32, 33, and 34, and a solder resist layer 25, which are stacked on the lower surface of the core substrate 11. The stacked body 20 further includes a surface-processed layer 35 formed on the lower surface of the wiring layer 34.

The material of the insulation layers 21 to 24 may be, for example, an insulative resin such as epoxy resin and polyimide resin, or a resin material obtained by mixing the insulative resin with a filler such as silica and alumina. The material of the wiring layers 31 to 34 may be, for example, copper (Cu) or a copper alloy.

The insulation layer 21 is formed on the lower surface of the core substrate 11 and covers the wiring layer 14. The wiring layer 31 is formed on the lower surface of the insulation layer 21. The wiring layer 31 includes via wirings extending through the insulation layer 21 in the thickness-wise direction and wiring patterns formed on the lower surface of the insulation layer 21. The wiring patterns are electrically connected to the wiring layer 14 via the via wirings of the wiring layer 31.

The insulation layer 22 is formed on the lower surface of the insulation layer 21 and covers the wiring layer 31. The wiring layer 32 is formed on the lower surface of the insulation layer 22. The wiring layer 32 includes via wirings extending through the insulation layer 22 in the thickness-wise direction and wiring patterns formed on the lower surface of the insulation layer 22. The wiring patterns are electrically connected to the wiring layer 31 via the via wirings of the wiring layer 32.

The insulation layer 23 is formed on the lower surface of the insulation layer 22 and covers the wiring layer 32. The wiring layer 33 is formed on the lower surface of the insulation layer 23. The wiring layer 33 includes via wirings extending through the insulation layer 23 in the thickness-wise direction and wiring patterns formed on the lower surface of the insulation layer 23. The wiring patterns are electrically connected to the wiring layer 32 via the via wirings of the wiring layer 33.

The insulation layer 24 is formed on the lower surface of the insulation layer 23 and covers the wiring layer 33. The wiring layer 34 is formed on the lower surface of the insulation layer 24. The wiring layer 34 includes via wirings extending through the insulation layer 24 in the thickness-wise direction and wiring patterns formed on the lower surface of the insulation layer 24. The wiring patterns are electrically connected to the wiring layer 33 via the via wirings of the wiring layer 34.

The solder resist layer 25 is formed on the lower surface of the insulation layer 24 and covers the lower surface of the insulation layer 24 and a portion of the wiring layer 34. The solder resist layer 25 includes openings 25X partially exposing the lower surface of the wiring layer 34.

The surface-processed layer 35 is formed on the lower surface of the wiring layer 34 exposed in the openings 25X of the solder resist layer 25. Examples of the surface-processed layer 35 include gold (Au) layer, nickel (Ni) layer/Au layer (metal layer in which Ni layer is used as bottom layer, and Au layer is formed on Ni layer), Ni layer/palladium (Pd) layer/Au layer (metal layer in which Ni layer is used as bottom layer, and Ni layer, Pd layer, and Au layer are sequentially stacked). Each of the Au layer, the Ni layer, and the Pd layer may be, for example, an electroless plated metal layer formed through an electroless plating process. The Au layer is a metal layer formed with Au or a Au alloy, the Ni layer is a metal layer formed with Ni or a Ni alloy, and the Pd layer is a metal layer formed with Pd or a Pd alloy. The surface-processed layer 35 may be formed by performing an anti-oxidation process such as an organic solderability preservative (OSP) process on the lower surface of the wiring layer 34. When the OSP process is performed, the surface-processed layer 35 is formed of, for example, a coating of an organic compound such as an azole compound or an imidazole compound on the lower surface of the wiring layer 34.

The lower surface of the surface-processed layer 35 is used as external connection pads P12. The external connection pads P12 may be connected to external connection terminals that are used to mount the electronic component-incorporating substrate 1 on a mount substrate such as a motherboard. The external connection terminals may be, for example, solder bumps, solder balls, or lead pins. The surface-processed layer 35 may be omitted. In this case, the lower surface of the wiring layer 34 exposed in the openings 25X of the solder resist layer 25 may be used as the external connection pads P12.

The stacked body 40 includes a plurality (five in FIG. 1) of insulation layers 41, 42, 43, 44, and 45, a plurality (four in FIG. 1) of wiring layers 51, 52, 53, and 54, and a solder resist layer 46, which are stacked on the upper surface of the core substrate 11.

The material of the insulation layers 41 to 45 may be, for example, an insulative resin such as epoxy resin and polyimide resin, or a resin material obtained by mixing the insulative resin with a filler such as silica and alumina. The material of the wiring layers 51 to 54 may be, for example, copper or a copper alloy.

The insulation layer 41 is formed on the upper surface of the core substrate 11 and covers the wiring layer 15. The wiring layer 51 is formed on the upper surface of the insulation layer 41. The wiring layer 51 includes via wirings extending through the insulation layer 41 in the thickness-wise direction and wiring patterns formed on the upper surface of the insulation layer 41. The wiring patterns are electrically connected to the wiring layer 15 via the via wirings of the wiring layer 51.

The insulation layer 42 is formed on the upper surface of the insulation layer 41 and covers the wiring layer 51. The wiring layer 52 is formed on the upper surface of the insulation layer 42. The wiring layer 52 includes via wirings extending through the insulation layer 42 in the thickness-wise direction and wiring patterns formed on the upper surface of the insulation layer 42. The wiring patterns are electrically connected to the wiring layer 51 via the via wirings of the wiring layer 52.

The wiring layer 52 further includes a mount portion 60 located on the upper surface of the insulation layer 42. Thus, the mount portion 60 is formed of, for example, a metal such as copper or a copper alloy. The mount portion 60 is planar and has a larger area than the electronic component 80 in plan view. For example, the mount portion 60 is rectangular in plan view. The mount portion 60 includes a first accommodation portion 71 formed in an upper surface 60a of the mount portion 60. The first accommodation portion 71 is recessed from the upper surface 60a of the mount portion 60. The upper surface 60a is a flat surface.

The insulation layer 43 is formed on the upper surface of the insulation layer 42 and covers the wiring layer 52. The insulation layer 43 includes an opening 43X partially exposing the mount portion 60. The opening 43X exposes the first accommodation portion 71 of the mount portion 60 and also partially exposes the upper surface 60a of the mount portion 60 located around the first accommodation portion 71 as an upper surface peripheral portion 60b. The upper surface peripheral portion 60b is located at an outer side of the first accommodation portion 71 and has the form of a frame that surrounds the first accommodation portion 71 in plan view (refer to FIG. 3).

The wiring layer 53 is formed on the upper surface of the insulation layer 43. The wiring layer 53 includes via wirings extending through the insulation layer 43 in the thickness-wise direction and wiring patterns formed on the upper surface of the insulation layer 43. The wiring patterns are electrically connected to the wiring layer 52 via the via wirings of the wiring layer 53.

The insulation layer 44 is formed on the upper surface of the insulation layer 43 and covers the wiring layer 53. The insulation layer 44 includes an opening 44X partially exposing the mount portion 60. In the present example, the opening 44X of the insulation layer 44 is continuous with the opening 43X of the insulation layer 43. For example, the openings 43X and 44X are formed so that wall surfaces of the openings 43X and 44X are continuous with each other. Thus, in the same manner as the opening 43X, the opening 44X exposes the first accommodation portion 71 of the mount portion 60 and the upper surface peripheral portion 60b of the mount portion 60 located around the first accommodation portion 71.

The openings 43X and 44X of the insulation layers 43 and 44 form a second accommodation portion 72, which is larger than the first accommodation portion 71 of the mount portion 60. The first accommodation portion 71 of the mount portion 60, the upper surface peripheral portion 60b of the mount portion 60, and the second accommodation portion 72 define the accommodation portion 70 accommodating the electronic component 80. In other words, the accommodation portion 70 is formed as a stepped accommodation portion that includes the first accommodation portion 71 of the mount portion 60 and the second accommodation portion 72, which is larger than the first accommodation portion 71.

The accommodation portion 70 accommodates the electronic component 80. The electronic component 80 includes a component body 81 and connection pads 82 arranged on an upper surface 81a of the component body 81. The component body 81 (electronic component 80) has a rear surface 81b opposite to the upper surface 81a. The rear surface 81b is adhered to the first accommodation portion 71 of the mount portion 60 by an adhesive 85. The electronic component 80 may be, for example, an electronic component such as a capacitor, a coil, or a resistor. Alternatively, the electronic component 80 may be, for example, a chip component such as a semiconductor chip (e.g., CPU) or a wiring structural body. The material of the adhesive 85 may be, for example, an adhesive resin sheet (e.g., non conductive film (NCF)) or a resin paste (e.g., non conductive paste (NCP)). Alternatively, the adhesive 85 may be an organic adhesive including silicone resin or polyimide resin as a main component.

The insulation layer 45 is formed on the upper surface of the insulation layer 44 and covers the upper surface of the insulation layer 44, the electronic component 80, and the connection pads 82. The insulation layer 45 fills the openings 44X and 43X (i.e., second accommodation portion 72) in the insulation layers 44 and 43 and covers side surfaces of the electronic component 80 and wall surfaces of the openings 44X and 43X. The wiring layer 54 is formed on the upper surface of the insulation layer 45.

The wiring layer 54 includes via wirings 54Va extending through the insulation layer 45 in the thickness-wise direction and wiring patterns 54Pa formed on the upper surface of the insulation layer 45. The wiring patterns 54Pa are electrically connected to the connection pads 82 of the electronic component 80 via the via wirings 54Va. In addition, the wiring layer 54 includes via wirings 54Vb extending through the insulation layers 45 and 44 in the thicknesswise direction and wiring patterns 54Pb formed on the upper surface of the insulation layer 45. The wiring patterns 54Pb are electrically connected to the wiring layer 53 via the via wirings 54Vb.

The solder resist layer 46 is formed on the upper surface of the insulation layer 45 and covers the upper surface of the insulation layer 45 and a portion of the wiring layer 54. The solder resist layer 46 includes openings 46X partially exposing the upper surface of the wiring layer 54 as external connection pads P11. The material of the solder resist layer 46 may be, for example, an insulative resin such as epoxy resin or acrylic resin.

A surface-processed layer may be formed on the upper surface of the wiring layer 54 exposed in the openings 46X. Examples of the surface-processed layer include a Au layer, a Ni layer/Au layer, and a Ni layer/Pd layer/Au layer. Each of the Au layer, the Ni layer, and the Pd layer may be, for example, an electroless plated metal layer formed through an electroless plating process. The Au layer is a metal layer formed with Au or a Au alloy, the Ni layer is a metal layer formed with Ni or a Ni alloy, and the Pd layer is a metal layer formed with Pd or a Pd alloy. An anti-oxidation process such as an OSP process may be performed on the upper surface of the wiring layer 54 to form a surface-processed layer. When the OSP process is performed, for example, a surface-processed layer of a coating of an organic compound such as an azole compound or an imidazole compound is formed on the upper surface of the wiring layer 54 (external connection pads P11). When a surface-processed layer is formed on the upper surface of the wiring layer 54 exposed in the openings 46X, the surface-processed layer may be used as the external connection pads P11.

An electronic device 100 is mounted on the electronic component-incorporating substrate 1. The electronic device 100 includes connection pads 101. The connection pads 101 are connected to the external connection pads P11 of the electronic component-incorporating substrate 1 by solder 105. The electronic device 100 includes one or more chips including, for example, a logic chip such as a CPU chip or a graphics processing unit (GPU) chip and a memory chip such as a dynamic random access memory (DRAM) chip, a static random access memory (SRAM) chip, or a flash memory chip. One or more of the chips may be directly connected to the external connection pads P11.

The accommodation portion 70 will now be described.

Figure 2:
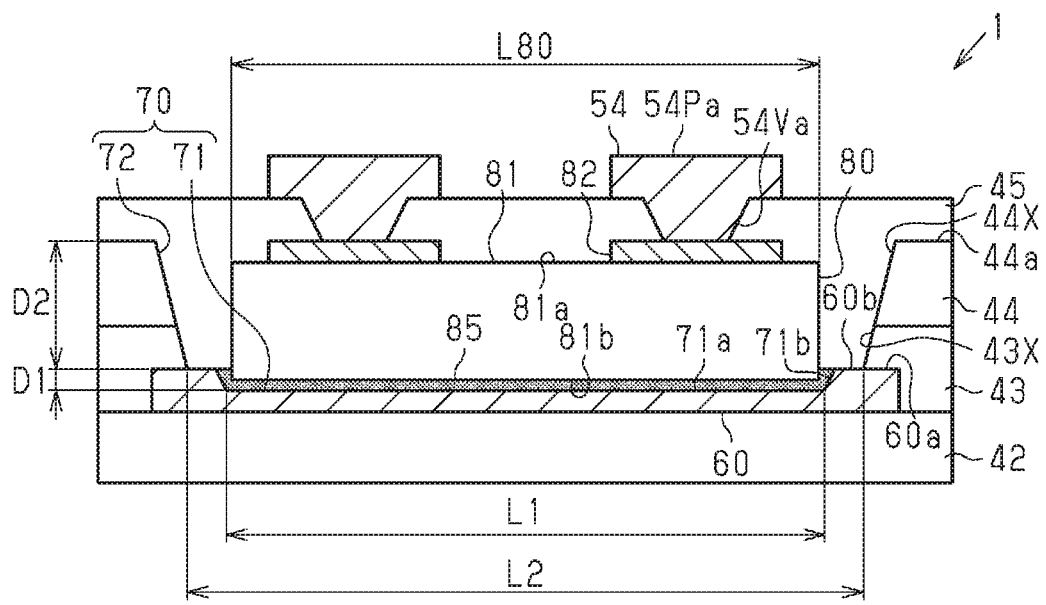
FIG. 2 is a partial enlarged cross-sectional view of the electronic component-incorporating substrate illustrated in FIG. 1 schematically illustrating an accommodation portion and the electronic component.
Figure 3:
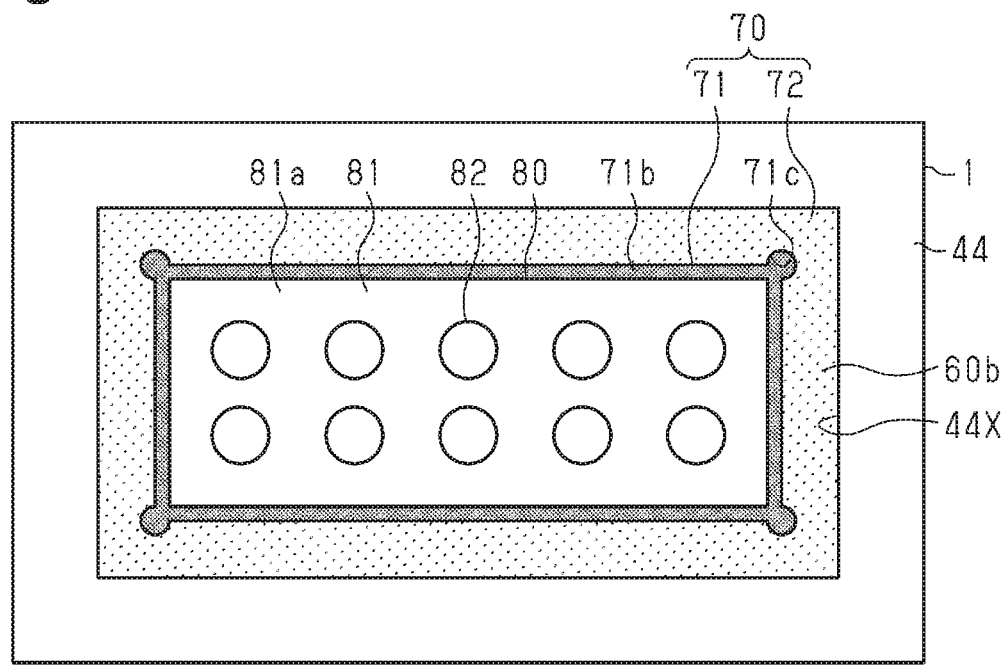
FIG. 3 is a schematic plan view of the accommodation portion and the electronic component illustrated in FIG. 2.

FIG. 2 is a partial enlarged cross-sectional view of the electronic component-incorporating substrate 1 schematically illustrating the accommodation portion 70 and the electronic component 80. FIG. 3 is a schematic plan view of the accommodation portion 70 and the electronic component 80 illustrated in FIG. 2. FIGS. 2 and 3 do not illustrate the solder resist layer 46 illustrated in FIG. 1. Also, FIG. 3 does not illustrate the insulation layer 45 and the wiring layer 54.

As illustrated in FIG. 2, the electronic component-incorporating substrate 1 includes the insulation layers 43 and 44 and the mount portion 60 including the first accommodation portion 71 in the upper surface 60a. The insulation layers 43 and 44 include the openings 43X and 44X exposing the first accommodation portion 71 and the upper surface peripheral portion 60b of the mount portion 60 located around the first accommodation portion 71. The openings 43X and 44X form the second accommodation portion 72. The first accommodation portion 71 and the second accommodation portion 72 form the accommodation portion 70 accommodating the electronic component 80. The electronic component 80 includes the connection pads 82 arranged on the upper surface 81a and is adhered to a bottom surface 71a of the first accommodation portion 71 by the adhesive 85. The electronic component-incorporating substrate 1 further includes the insulation layer 45, which covers the electronic component 80, the connection pads 82, and the insulation layer 44, and the wiring layer 54 formed on the upper surface of the insulation layer 45. The wiring layer 54 includes the via wirings 54Va extending through the insulation layer 45 and the wiring patterns 54Pa connected to the connection pads 82 of the electronic component 80 via the via wirings 54Va.

The first accommodation portion 71 of the mount portion 60 includes the bottom surface 71a and side surfaces 71b connecting the bottom surface 71a to the upper surface peripheral portion 60b of the mount portion 60. The side surfaces 71b of the first accommodation portion 71 are inclined so that the width of the first accommodation portion 71 is increased from the bottom surface 71a of the first accommodation portion 71 to the upper surface 60a (upper surface peripheral portion 60b) of the mount portion 60.

The first accommodation portion 71 is formed through a laser drilling process that irradiates the upper surface 60a of the mount portion 60 with laser beams. A general laser drilling device such as a $CO_2$ laser or a UV-YAG laser may be used as the device that irradiates with laser beams.

The size of the first accommodation portion 71 is set in accordance with the size of the electronic component 80 accommodated in the first accommodation portion 71 and the drilling position accuracy of laser drilling that forms the first accommodation portion 71. The length L1 of the bottom surface 71a of the first accommodation portion 71 is set in accordance with the length L80 of the electronic component 80 and the drilling position accuracy of the laser drilling. The length L80 of the electronic component 80 is, for example, 1 mm. The drilling position accuracy of the laser drilling is, for example, ±5 to ±10 μm. The depth D1 of the first accommodation portion 71, which corresponds to the distance (height) from the bottom surface 71a of the first accommodation portion 71 to the upper surface peripheral portion 60b of the mount portion 60, is, for example, 5 to 20 μm.

The wall surfaces of the openings 43X and 44X in the insulation layers 43 and 44 form wall surfaces of the second accommodation portion 72. The wall surfaces of the second accommodation portion 72 are inclined so that the width of the second accommodation portion 72 increases from the upper surface peripheral portion 60b of the mount portion 60 toward the upper surface of the insulation layer 44. The size of the second accommodation portion 72 is set in accordance with the size of the electronic component 80 accommodated in the second accommodation portion 72, the position accuracy of a mount device/transport device that mounts the electronic component 80 (i.e., accuracy of mounting the electronic component 80), and the drilling position accuracy of a drilling device that forms the second accommodation portion 72. The length L2 of the lower end of the second accommodation portion 72 is set in accordance with the length L80 of the electronic component 80, the position accuracy of the mount device/transport device (i.e., accuracy of mounting the electronic component 80), and the drilling position accuracy of the drilling device that forms the second accommodation portion 72. The drilling device may be, for example, a laser drilling device such as a $CO_2$ laser or a UV-YAG laser that irradiates with laser beams. In this case, the position accuracy of forming the second accommodation portion 72 may be the same level (±5 to ±10 µm) as the position accuracy of forming the first accommodation portion 71. The accuracy of mounting the electronic component 80 with the mount device is approximately ±20 µm. The depth D2 of the second accommodation portion 72, which corresponds to the distance (height) from the upper surface peripheral portion 60b of the mount portion 60 to an upper surface 44a of the insulation layer 44, is, for example, 50 to 100 µm. The width (dimension in plan view) of the upper surface peripheral portion 60b, which corresponds to the distance (length) from an upper end of the side surfaces 71b of the first accommodation portion 71 to a lower end of the wall surfaces of the second accommodation portion 72, is, for example, 20 µm.

As illustrated in FIG. 3, a plurality (ten in FIG. 3) of connection pads 82 are arranged on the upper surface 81a of the electronic component 80. The first accommodation portion 71 is rectangular in plan view in conformance with the shape of the electronic component 80. The first accommodation portion 71 includes recesses 71c extending outward from the first accommodation portion 71. In the example illustrated in FIG. 3, the recesses 71c extend outward from corners of the first accommodation portion 71 in plan view. The corners of the first accommodation portion 71 are intersecting portions of adjacent ones of the side surfaces 71b of the first accommodation portion 71 in plan view. The recesses 71c are each arcuate in plan view. The recesses 71c may have a tetragonal shape or any other polygonal shape. When adhering the electronic component 80 to the first accommodation portion 71 with the adhesive 85, the first accommodation portion 71 and the recesses 71c allow an excess of the adhesive 85 to enter the recesses 71c. This limits displacement of the electronic component 80 caused by the adhesive 85. The recesses 71c may be formed in at least one of the intersecting portions. The recesses 71c may extend outward from each side surface 71b of the first accommodation portion 71. The recesses 71c may be formed in each side surface 71b and each corner of the first accommodation portion 71. The recesses 71c may be omitted.

Manufacturing Method

Manufacturing steps of the electronic component-incorporating substrate 1 will now be described.

Figure 10:
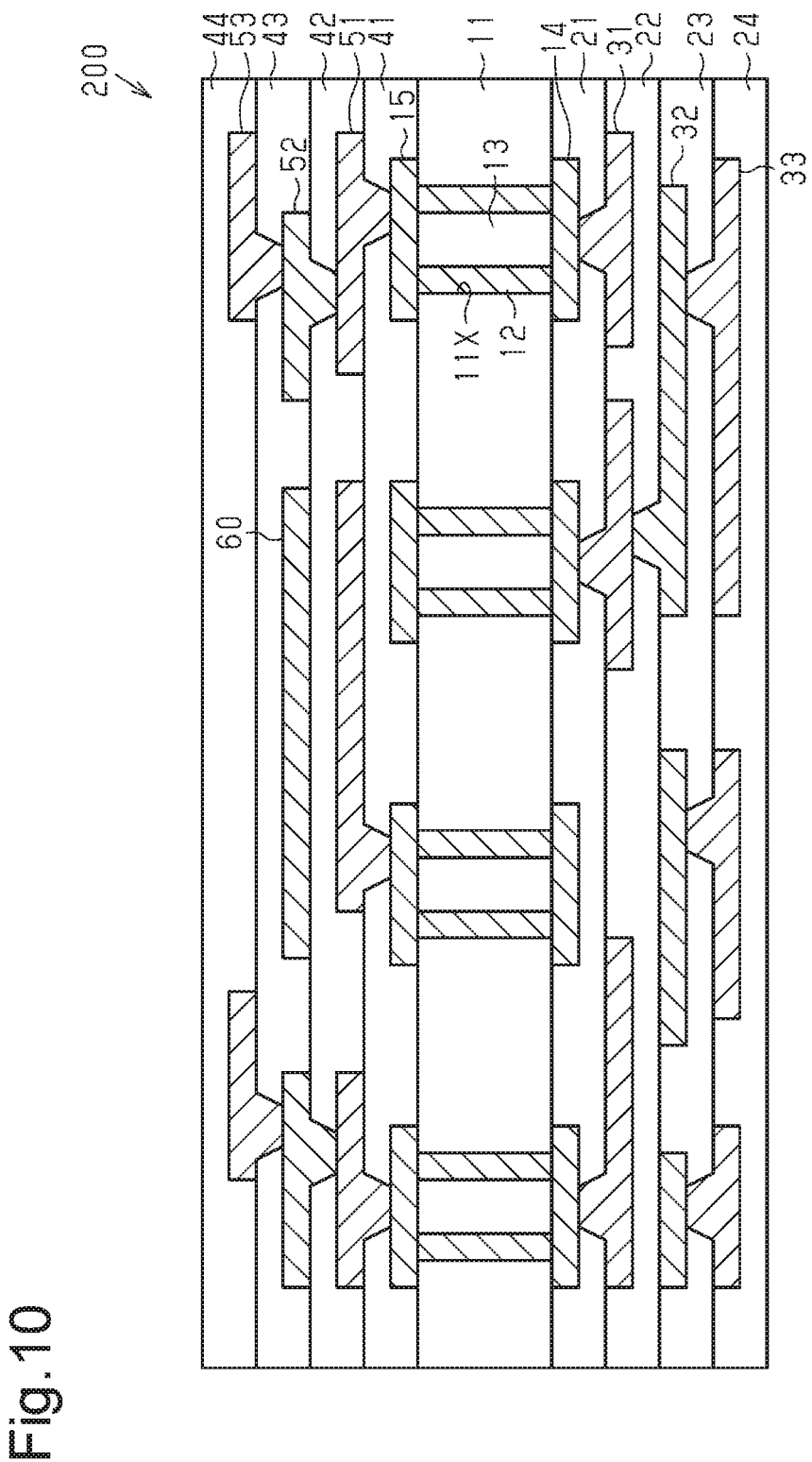

In the step illustrated in FIG. 10, a wiring substrate 200 is prepared. The wiring substrate 200 is a stacked structural body in a state before the accommodation portion 70 is formed on the electronic component-incorporating substrate 1.

The core substrate 11 is prepared. For example, a copper clad laminated (CCL) board is used as the core substrate 11. The through holes 11X are formed in the CCL board, and electrolytic plating is performed on the wall surfaces of the through holes 11X to form the through electrodes 12. The inner through holes in the through electrodes 12 are filled with the resin material 13. Subsequently, for example, a subtractive process is performed to form the wiring layers 14 and 15. Alternatively, a conductive paste filling process may be performed to fill the through holes 11X with a conductive paste and form through electrodes.

The insulation layer 21 is formed to cover the wiring layer 14, and the insulation layer 41 is formed to cover the wiring layer 15. The material of the insulation layers 21 and 41 may be, for example, an organic resin such as epoxy resin and polyimide resin, or a resin material obtained by mixing the resin with a filler such as silica or alumina. The insulation layer 21 may be formed, for example, by vacuum-laminating the lower surface of the core substrate 11 with a resin film and heating the resin film to cure the resin film. The insulation layer 41 may be formed in the same manner. Alternatively, instead of using a resin film, a resin paste or a liquid resin may be applied and heated to form the insulation layers 21 and 41.

The wiring layer 31 is formed on the lower surface of the insulation layer 21, and the wiring layer 51 is formed on the upper surface of the insulation layer 41. For example, via holes may be formed in the insulation layers 21 and 41 to partially expose the respective wiring layers 14 and 15. After a desmear process is performed as necessary, for example, a semi-additive process may be performed to form the wiring layers 31 and 51.

The insulation layer 22 is formed to cover the wiring layer 31, and the insulation layer 42 is formed to cover the wiring layer 51. The material of the insulation layers 22 and 42 may be, for example, an organic resin such as epoxy resin and polyimide resin, or a resin material obtained by mixing the resin with a filler such as silica or alumina. The insulation layer 22 may be formed, for example, by vacuum-laminating the lower surface of the insulation layer 21 with a resin film and heating the resin film to cure the resin film. The insulation layer 42 may be formed in the same manner. Alternatively, instead of using a resin film, a resin paste or a liquid resin may be applied and heated to form the insulation layers 22 and 42.

The wiring layer 32 is formed on the lower surface of the insulation layer 22, and the wiring layer 52 is formed on the upper surface of the insulation layer 42. For example, via holes may be formed in the insulation layers 22 and 42 to partially expose the respective wiring layers 31 and 51. After a desmear process is performed as necessary, for example, a semi-additive process may be performed to form the wiring layers 32 and 52.

The insulation layer 23 is formed to cover the wiring layer 32, and the insulation layer 43 is formed to cover the wiring layer 52. The material of the insulation layers 23 and 43 may be, for example, an organic resin such as epoxy resin and polyimide resin, or a resin material obtained by mixing the resin with a filler such as silica or alumina. The insulation layer 23 may be formed, for example, by vacuum-laminating the lower surface of the insulation layer 22 with a resin film and heating the resin film to cure the resin film. The insulation layer 43 may be formed in the same manner. Alternatively, instead of using a resin film, a resin paste or a liquid resin may be applied and heated to form the insulation layers 23 and 43.

The wiring layer 33 is formed on the lower surface of the insulation layer 23, and the wiring layer 53 is formed on the upper surface of the insulation layer 43. For example, via holes may be formed in the insulation layers 23 and 43 to partially expose the wiring layers 32 and 52. After a desmear process is performed as necessary, for example, a semi-additive process may be performed to form the wiring layers 33 and 53.

The insulation layer 24 is formed to cover the wiring layer 33, and the insulation layer 44 is formed to cover the wiring layer 53. The material of the insulation layers 24 and 44 may be, for example, an organic resin such as epoxy resin or polyimide resin, or a resin material obtained by mixing the resin with a filler such as silica or alumina. The insulation layer 24 may be formed, for example, by vacuum-laminating the lower surface of the insulation layer 23 with a resin film and heating the resin film to cure the resin film. The insulation layer 44 may be formed in the same manner.

Alternatively, instead of using a resin film, a resin paste or a liquid resin may be applied and heated to form the insulation layers 24 and 44. The wiring substrate 200 is obtained through the steps described above.

In the step illustrated in FIG. 11A, the second accommodation portion 72 is formed in the insulation layers 43 and 44. FIG. 11A does not illustrate the portion illustrated below the core substrate 11 in FIG. 10. Drawings illustrated in such a manner may be referred to when the manufacturing steps are described below. In the present example, the upper surface of the insulation layer 44 is irradiated with laser beams at a position corresponding to the mount portion 60 to form the opening 44X extending through the insulation layer 44 and the opening 43X extending through the insulation layer 43 to expose the upper surface 60a of the mount portion 60. As a result, the second accommodation portion 72 is formed by the openings 43X and 44X through laser drilling. The mount portion 60, which is formed of metal, is used as a stopper layer in the laser drilling.

In the step illustrated in FIG. 11B, the first accommodation portion 71 is formed in the mount portion 60. In the present example, the upper surface 60a of the mount portion 60 is irradiated with laser beams to form the first accommodation portion 71 that is recessed from the upper surface 60a of the mount portion 60.

As described above, the steps illustrated in FIGS. 11A and 11B form the stepped accommodation portion, that is, the accommodation portion 70 including the first accommodation portion 71 and the second accommodation portion 72.

In the steps illustrated in FIGS. 12A and 12B, the electronic component 80 is mounted on the mount portion 60. As illustrated in FIG. 12A, the electronic component 80 is supported by a mounting jig 210 so that the upper surface 81a faces the mounting jig 210.

The adhesive 85 is applied to the first accommodation portion 71. The material of the adhesive 85 may be, for example, an adhesive resin sheet (e.g., NCF) or a resin paste (e.g., NCP). The adhesive 85 may be an organic adhesive including silicone resin or polyimide resin as a main component. Although FIG. 12A illustrates an example in which the adhesive 85 is applied to the first accommodation portion 71, the adhesive 85 may be applied to the rear surface 81b of the electronic component 80, and the electronic component 80 may be mounted on the mount portion 60.

As illustrated in FIG. 12B, the electronic component 80 is inserted into the accommodation portion 70 and mounted on the mount portion 60. At this time, the electronic component 80 is pressed toward the mount portion 60 with the mounting jig 210 so that the rear surface 81b of the electronic component 80 comes into tight contact with the adhesive 85. As a result, the electronic component 80 is firmly adhered to the mount portion 60 by the adhesive 85.

As illustrated in FIG. 13A, when mounting the electronic component 80, the electronic component 80 may be displaced due to, for example, the position accuracy of the mount device such as the mounting jig 210. In FIG. 13A, the electronic component 80 is displaced and located on the upper surface peripheral portion 60b of the mount portion 60. The mounting jig 210 is configured to be swingable. Thus, when the electronic component 80 is located on the upper surface peripheral portion 60b, the mounting jig 210 and the electronic component 80 are inclined due to the step between the bottom surface 71a of the first accommodation portion 71 and the upper surface 60a (upper surface peripheral portion 60b) of the mount portion 60. At this time, the force pressing the electronic component 80 toward the mount portion 60 moves the electronic component 80 in the direction indicated by the arrow. Consequently, as illustrated in FIG. 13B, the electronic component 80 enters the first accommodation portion 71 of the mount portion 60 and is appropriately arranged on the mount portion 60 (bottom surface 71a of first accommodation portion 71).

Figure 14:
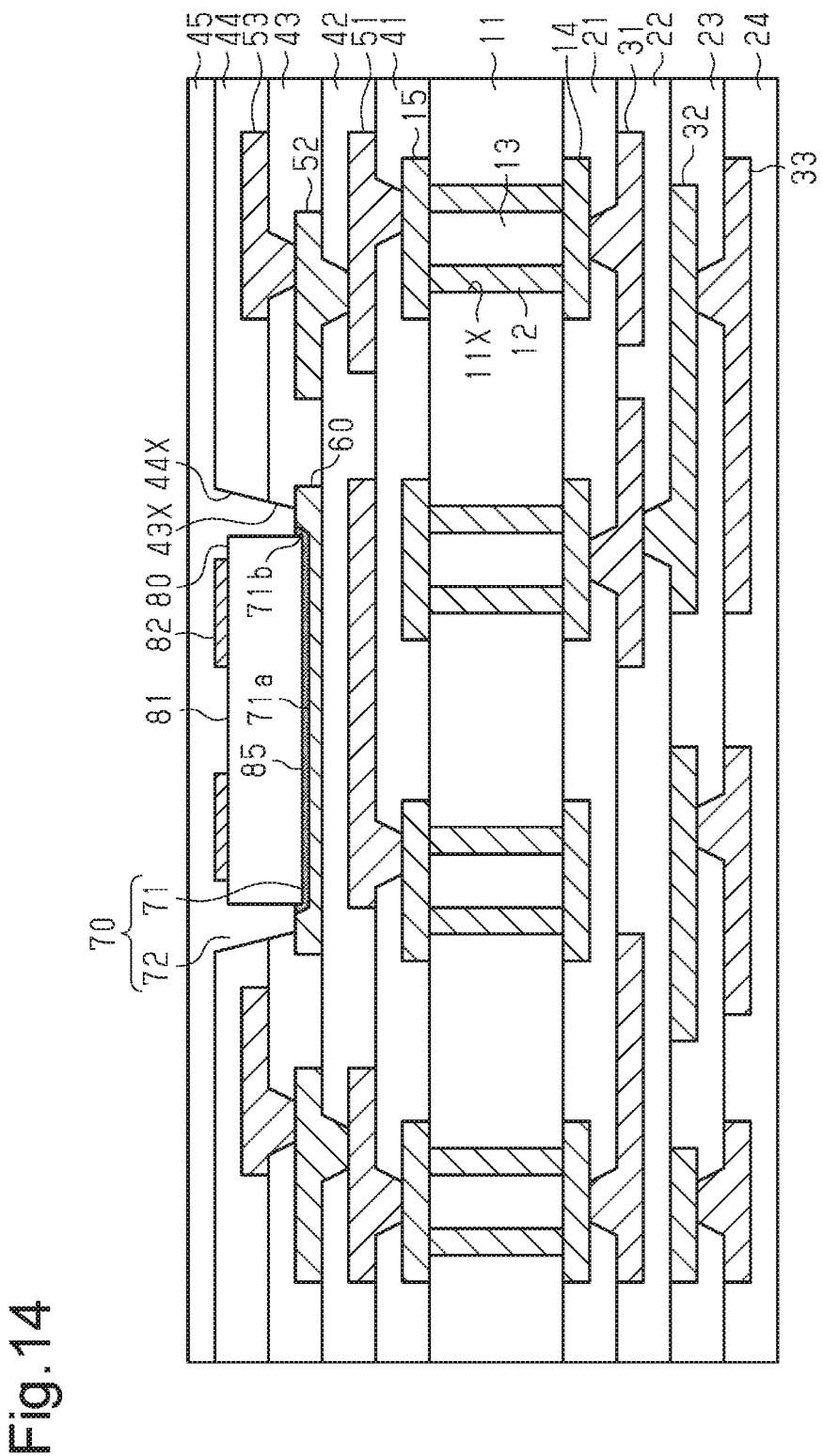

In the step illustrated in FIG. 14, the insulation layer 45 is formed to cover the electronic component 80, the connection pads 82, and the insulation layer 44. The material of the insulation layer 45 may be, for example, an organic resin such as epoxy resin and polyimide resin, or a resin material obtained by mixing the resin with a filler such as silica or alumina. The insulation layer 45 may be formed, for example, by vacuum-laminating the upper surface of the insulation layer 44 with a resin film that covers the electronic component 80 and heating the resin film to cure the resin film. Alternatively, instead of using a resin film, a resin paste or a liquid resin may be applied and heated to form the insulation layer 45.

Figure 15:
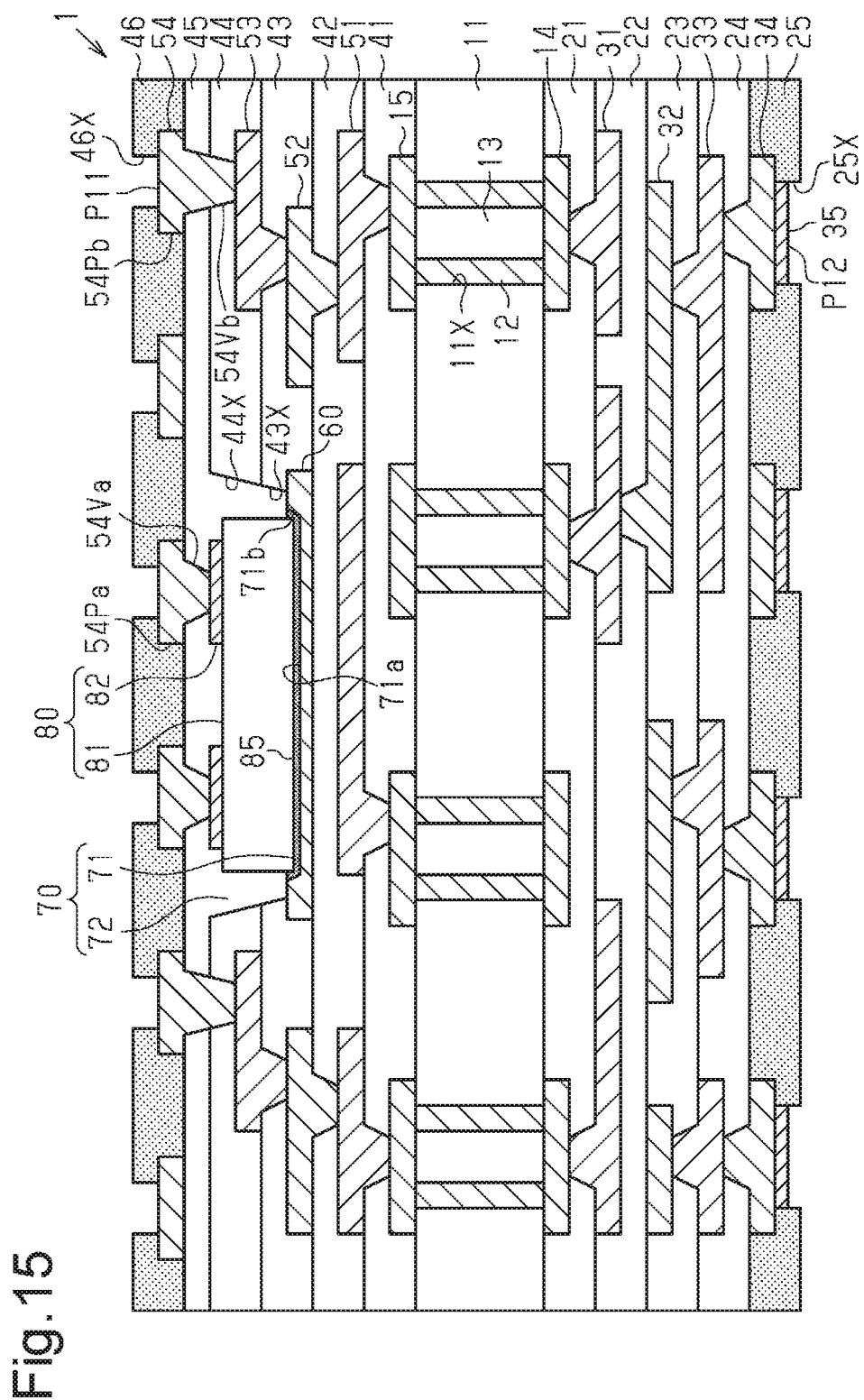

In the step illustrated in FIG. 15, the wiring layers 34 and 54, the solder resist layers 25 and 46, and the surface-processed layer 35 are formed.

First, the wiring layers 34 and 54 are formed. Through holes that partially expose the lower surface of the wiring layer 33 are formed in the insulation layer 24. Also, via holes that partially expose the connection pads 82 of the electronic component 80 and via holes that partially expose the upper surface of the wiring layer 53 are formed in the insulation layer 45. After a desmear process is performed as necessary, for example, a semi-additive process may be performed to form the wiring layers 34 and 54.

Next, the solder resist layers 25 and 46 are formed. The solder resist layer 25 may be formed, for example, by applying an insulative resin such as a liquid or paste photosensitive epoxy resin to the lower surface of the insulation layer 24 so that the wiring layer 34 is covered with the insulative resin. The insulative resin may be applied, for example, through a screen printing process, a roll coating process, or a spin coating process. The solder resist layer 46 may be formed in the same manner.

Next, the surface-processed layer 35 is formed. The surface-processed layer 35 may be formed, for example, through an electroless plating process. Alternatively, an anti-oxidation process such as an OSP process may be performed to form an organic coating as the surface-processed layer 35. The electronic component-incorporating substrate 1 illustrated in FIG. 1 is obtained through the steps described above.

The differences in configuration between the present embodiment and the comparative example will now be described.

The comparative example will now be described with reference to FIGS. 5A to 5C, 8, and 9. In the comparative example, the same reference characters are given to those elements that are the same as the corresponding elements of the present embodiment.

Figure 5A:
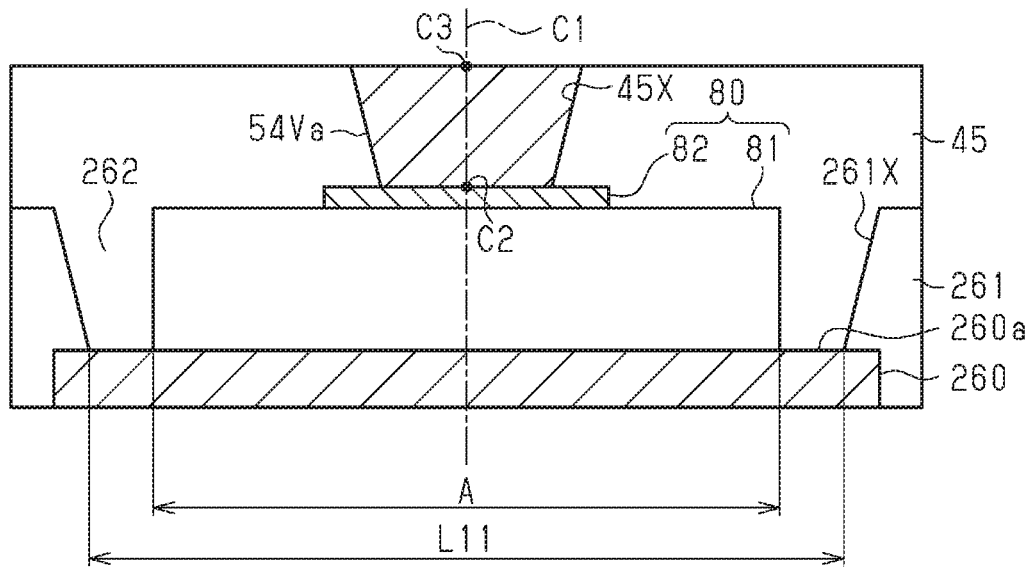
FIGS. 5A to 5C are schematic cross-sectional views illustrating the relationship between an electronic component and a via wiring in a comparative example, where
Figure 5B:
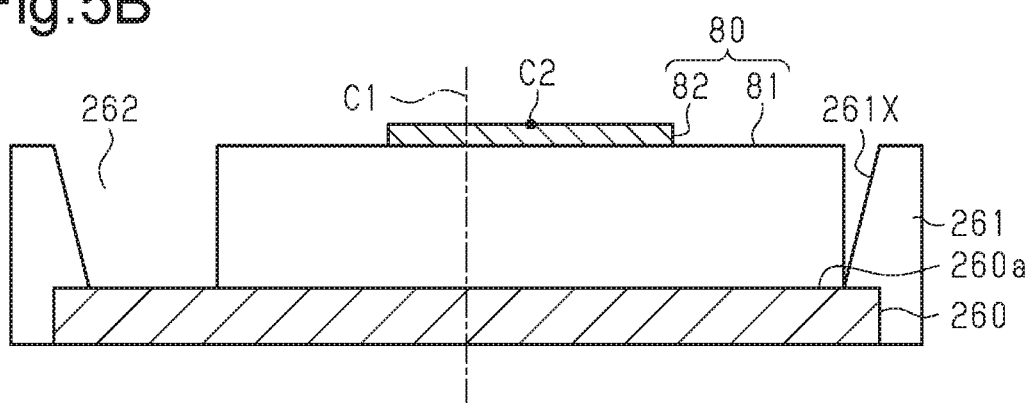
Figure 5C:
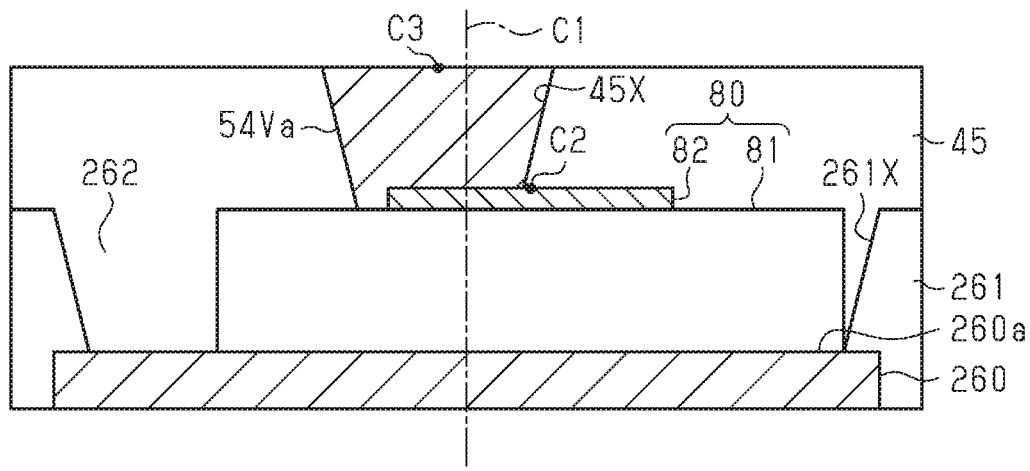

As illustrated in FIGS. 5A to 5C, a mount portion 260 of the comparative example includes an upper surface 260a that is entirely flat. That is, the mount portion 260 does not include an accommodation portion such as that of the present embodiment. Thus, an accommodation portion 262 of the comparative example is formed by only an opening 261X of an insulation layer 261. The size of the accommodation portion 262 is set in accordance with the size of the electronic component 80 mounted on the mount portion 260, the accuracy of mounting the electronic component 80, and the position accuracy of forming the opening 261X. In such a comparative example, when mounting the electronic component 80 on the mount portion 260 in the accommodation portion 262 or forming the insulation layer 45 to cover the electronic component 80, the mount position of the electronic component 80 may be displaced from the proper position that is indicated by double-dashed lines in FIGS. 8 and 9 (FIGS. 8 and 9 do not illustrate the insulation layer 45). Such displacement of the electronic component 80 includes movement (refer to FIG. 8) and/or rotation (refer to FIG. 9) of the mount portion 260 in the accommodation portion 262.

As illustrated in FIG. 5A, the via wirings 54Va are connected to the connection pads 82 of the electronic component 80. After the insulation layer 45 is formed to cover the electronic component 80, the via wirings 54Va are formed in via holes 45X that extend through the insulation layer 45. Thus, when forming the via holes 45X, the electronic component 80 is covered with the insulation layer 45 and invisible from outside. Hence, the via holes 45X are formed in accordance with the proper mount position of the electronic component 80 (position indicated by double-dashed lines in FIG. 8). If the electronic component 80 is displaced, the connection reliability of the connection pads 82 of the electronic component 80 with the via wirings 54Va may be lowered.

The relationship between the electronic component 80 and the accommodation portion 70 of the present embodiment will now be described with reference to FIGS. 2, 3, 6, and 7.

Figure 6:
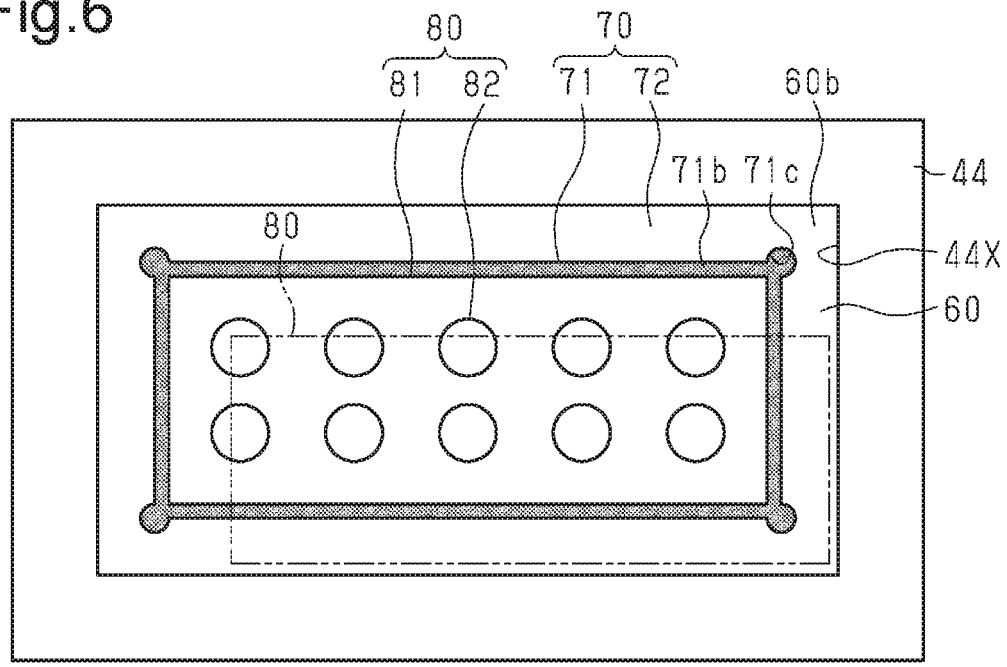
FIGS. 6 and 7 are schematic plan views illustrating the positional relationship between the accommodation portion and the electronic component in the embodiment.

As illustrated in FIGS. 2 and 6, the mount portion 60 includes the first accommodation portion 71. The size of the first accommodation portion 71 is set in accordance with the size of the electronic component 80 accommodated in the first accommodation portion 71 and the position accuracy of forming the first accommodation portion 71. The first accommodation portion 71 is smaller than the second accommodation portion 72, which is defined by the openings 43X and 44X of the insulation layers 43 and 44. In addition, as illustrated in FIG. 2, the first accommodation portion 71 has the form of a recess and includes the bottom surface 71a located at a lower position than the upper surface 60a of the mount portion 60. To facilitate understanding, FIGS. 3, 6, and 7 enlarge the upper surface peripheral portion 60b located around the first accommodation portion 71. The actual width (dimension from upper end of the side surfaces 71b of the first accommodation portion 71 to a lower end of the wall surfaces of the second accommodation portion 72 in plan view) of the upper surface peripheral portion 60b is smaller in relation to the size of the electronic component 80. Thus, when mounting, the electronic component 80 is accommodated in the first accommodation portion 71 by pressing force.

Figure 7:
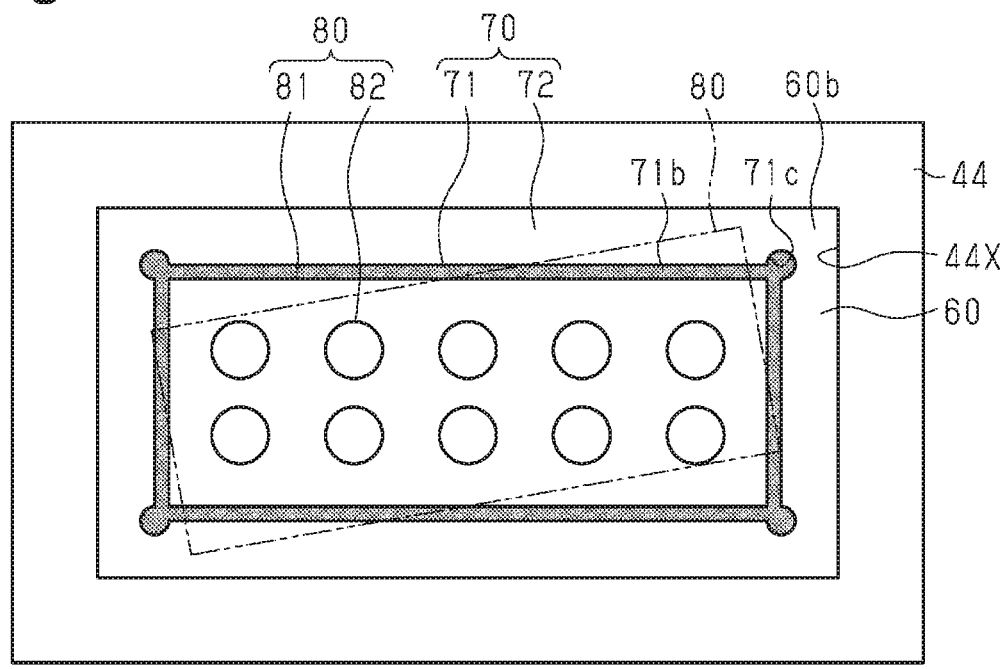
Figure 8:
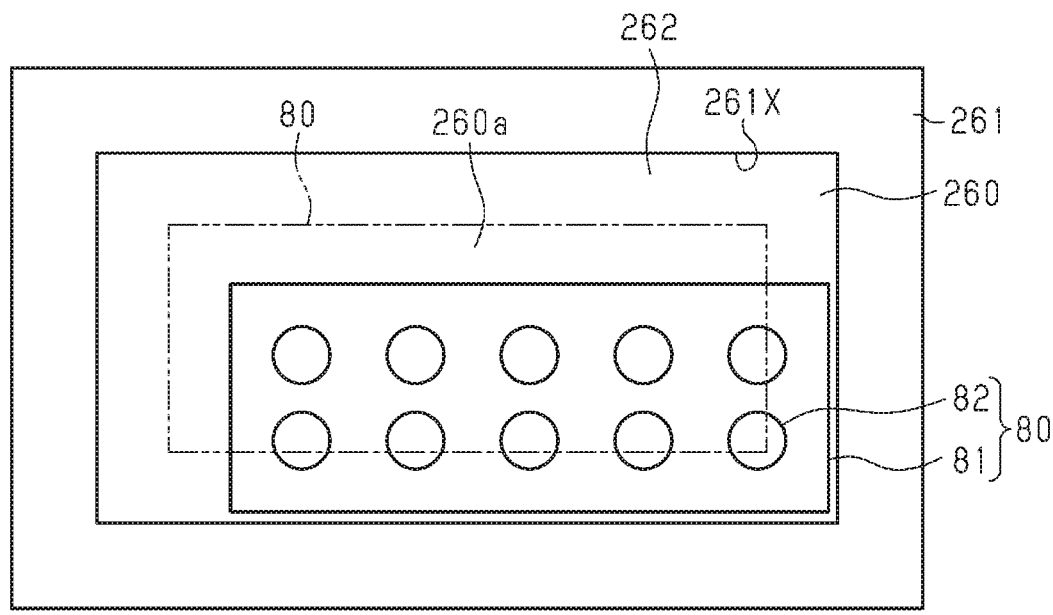
FIGS. 8 and 9 are schematic plan views illustrating displacement of the electronic component and the accommodation portion in the comparative example.
Figure 9:
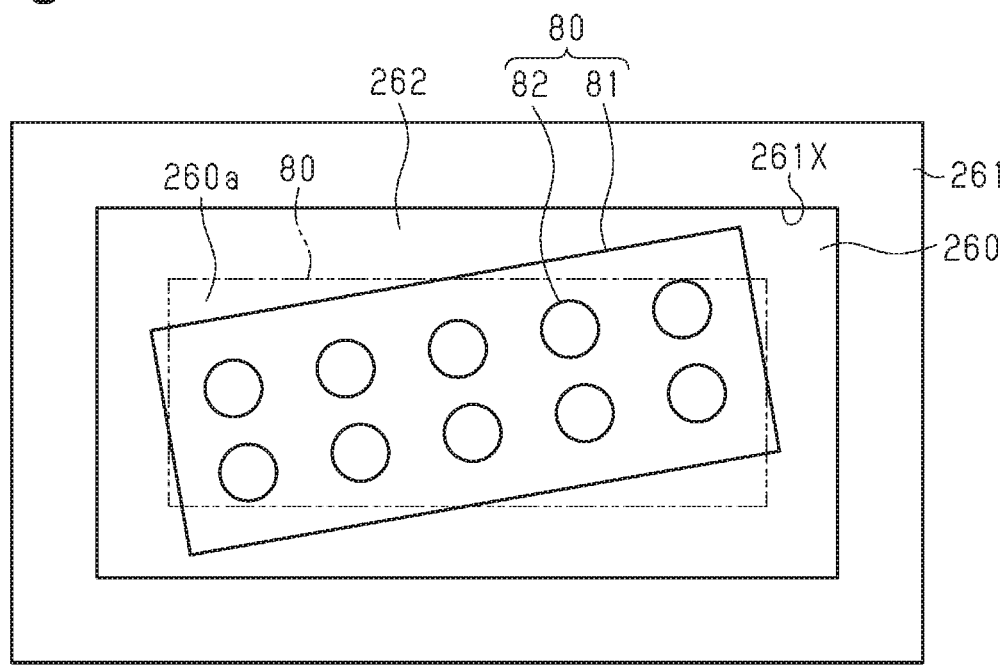

After the electronic component 80 is accommodated in the first accommodation portion 71, the side surfaces 71b of the first accommodation portion 71 restrict, for example, movement of the electronic component 80 indicated by double-dashed lines in FIG. 6 and rotation of the electronic component 80 indicated by double-dashed lines in FIG. 7. Thus, displacement of the via wirings 54Va from the connection pads 82 of the electronic component 80 is limited. This limits the lowering of the connection reliability.

The displacement and the connection reliability will now be described.

FIGS. 5A to 5C are explanatory diagrams illustrating the relationship between the electronic component 80 and the via wiring 54Va in the comparative example. In FIGS. 5A to 5C, the single-dashed lines indicate a designed center position C1 of the connection pad 82 and the via wiring 54Va.

FIG. 5A illustrates a state in which the electronic component 80 and the via wiring 54Va are not displaced. As illustrated in FIG. 5A, the accommodation portion 262 is defined by the upper surface 260a of the mount portion 260 and the opening 261X of the insulation layer 261. The electronic component 80 is mounted on the upper surface 260a of the mount portion 260. The insulation layer 261 corresponds to the insulation layers 43 and 44 of the embodiment. The electronic component 80 is covered with the insulation layer 45, and the connection pads 82 of the electronic component 80 are connected to the via wirings 54Va formed in the via holes 45X of the insulation layer 45. Each connection pad 82 is, for example, circular in plan view and has a diameter of, for example, 100 μm. The diameter of the lower end of the via wirings 54Va is, for example, 60 μm.

The size of the accommodation portion 262 is set in accordance with the size of the electronic component 80, the accuracy of mounting the electronic component 80, and the position accuracy of forming the accommodation portion 262. For example, the accuracy of mounting the electronic component 80 is ±20 μm, and the position accuracy of forming the accommodation portion 262 is ±10 μm. The position accuracy of forming the via holes 45X in the insulation layer 45, in which the via wirings 54Va are formed, is ±10 μm. The size of the electronic component 80 is represented by A (μm). In this case, the size L11 of the accommodation portion 262 is A+40+20 (μm) at a maximum.

FIG. 5B illustrates a state in which the electronic component 80 mounted on the mount portion 260 is displaced in the accommodation portion 262. For example, when the electronic component 80 is maximally displaced in the right direction in FIG. 5B, a center position C2 of the connection pad 82 of the electronic component 80 is deviated from the designed center C1 by 30 μm in the right direction.

As illustrated in FIG. 5C, after the insulation layer 45 is formed to cover the electronic component 80, the via hole 45X is formed in the insulation layer 45. As described above, the position accuracy of forming the via holes 45X is ±10 μm. When the position in which the via hole 45X is formed is displaced in a direction (left direction in FIG. 5C) opposite to the direction in which the electronic component 80 is moved (right direction in FIGS. 5B and 5C), a center position C3 of the via wiring 54Va formed in the via hole 45X is deviated from the designed center 1C by 10 μm in the left direction.

As a result, the displacement amount between the center position C2 of the connection pad 82 and the center position C3 of the via wiring 54Va is 40 μm. Since the diameter of the connection pad 82 is 100 μm, the lower end of the via wiring 54Va extends 20 μm from the connection pad 82. This decreases the area of contact between the via wiring 54Va and the connection pad 82 and lowers the connection reliability of the via wiring 54Va with the connection pad 82. Even when the via hole 45X is not displaced, the lower end of the via wiring 54Va extends 10 μm from the connection pad 82. This lowers the connection reliability. Furthermore, because the component body 81 of the electronic component 80 is irradiated with laser beams that form the via holes 45X, the component body 81 may be damaged. This may lower the connection reliability.

The connection between the electronic component 80 and the via wiring 54Va of the present embodiment will now be described.

Figure 4A:
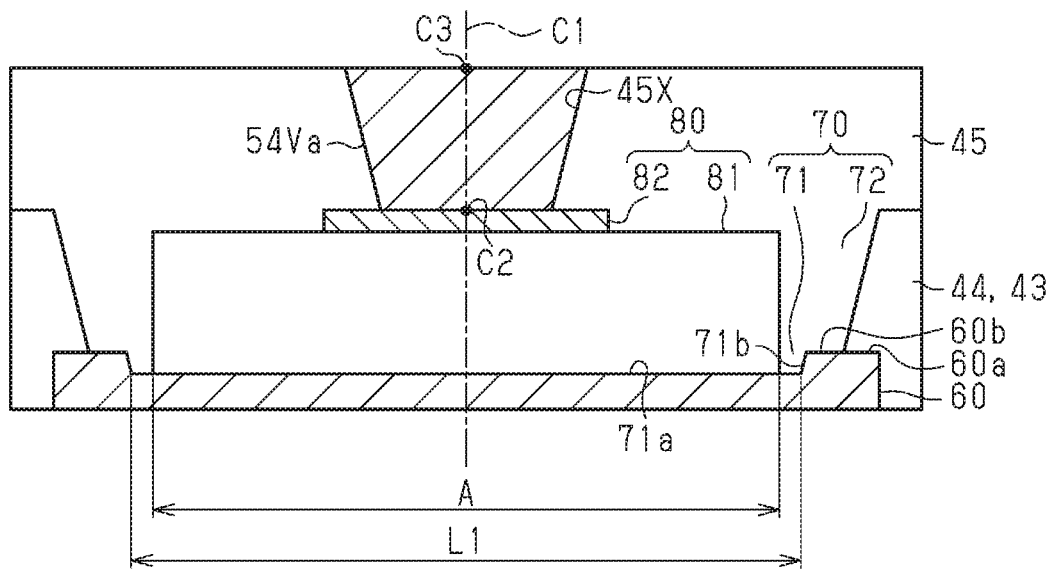
FIGS. 4A to 4C are schematic cross-sectional views illustrating the relationship between an electronic component and a via wiring in the embodiment, where
Figure 4B:
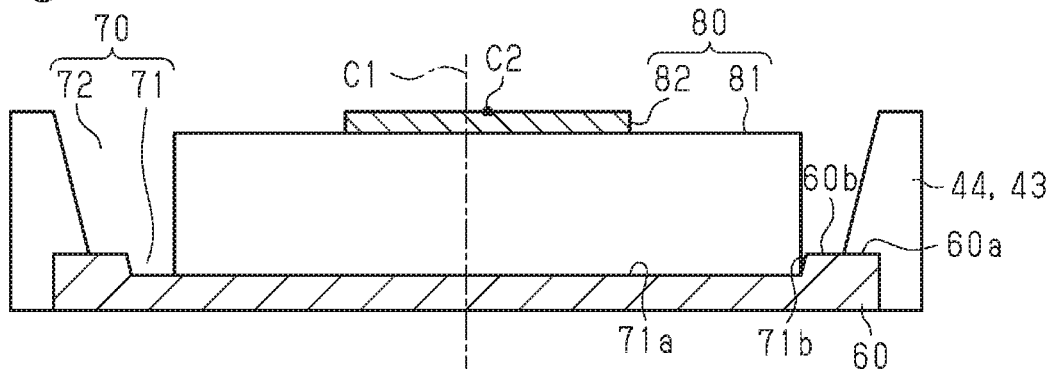
Figure 4C:
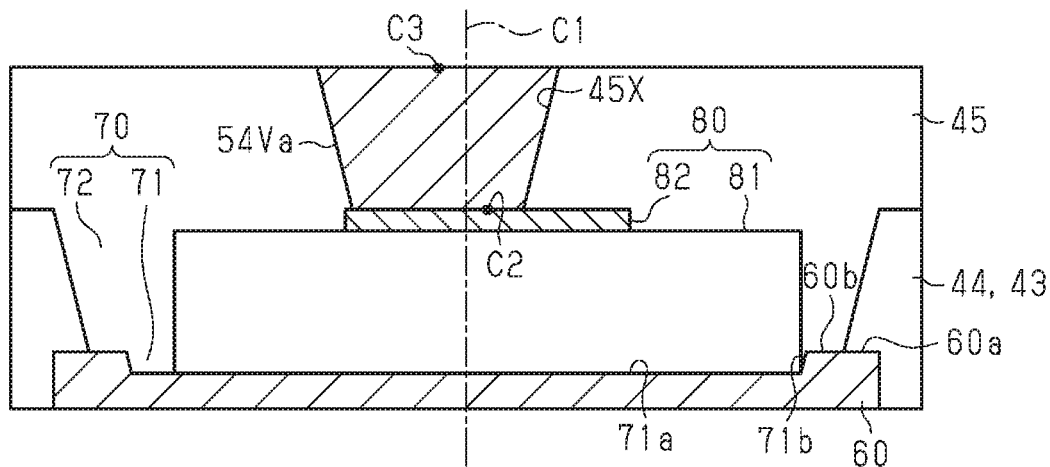

FIGS. 4A to 4C are explanatory diagrams illustrating the relationship between the electronic component 80 and the via wiring 54Va in the present embodiment. In FIGS. 4A to 4C, the single-dashed lines indicate a designed center position C1 of the connection pad 82 and the via wiring 54Va.

FIG. 4A illustrates a state in which the electronic component 80 and the via wiring 54Va are not displaced.

As illustrated in FIG. 4A, the electronic component 80 is accommodated in the accommodation portion 70, which is formed by the first accommodation portion 71 of the mount portion 60 and the second accommodation portion 72 of the insulation layers 43 and 44, and is mounted on the mount portion 60 in the first accommodation portion 71. The electronic component 80 is covered with the insulation layer 45, and the connection pads 82 of the electronic component 80 are connected to the via wirings 54Va formed in the via holes 45X of the insulation layer 45. Each connection pad 82 is, for example, circular in plan view and has a diameter of, for example, 100 μm. The diameter of the lower end of the via wirings 54Va is, for example, 60 μm.

The size of the first accommodation portion 71 is set in accordance with the size of the electronic component 80 and the position accuracy of forming the accommodation portion 70. The position accuracy of forming the accommodation portion 70 is, for example, ±10 μm. The position accuracy of forming the via holes 45X in the insulation layer 45 is ±10 μm. The size of the electronic component 80 is represented by A (μm). In this case, the size L1 of the first accommodation portion 71 is A+20 (μm) at a maximum.

FIG. 4B illustrates a state in which the electronic component 80 mounted on the mount portion 60 is displaced in the first accommodation portion 71. For example, when the electronic component 80 is maximally displaced in the right direction in FIG. 4B, the center position C3 of the connection pad 82 of the electronic component 80 is deviated from the designed center C1 by 10 μm in the right direction.

As illustrated in FIG. 4C, after the insulation layer 45 is formed to cover the electronic component 80, the via hole 45X is formed in the insulation layer 45. As described above, the position accuracy of forming the via hole 45X is ±10 μm. When the position in which the via hole 45X is formed is displaced in a direction (left direction in FIG. 4C) opposite to the direction in which the electronic component 80 is moved (right direction in FIGS. 4B and 4C), a center position C3 of the via wiring 54Va formed in the via hole 45X is deviated from the designed center 1C by 10 μm in the left direction.

As a result, the displacement amount between the center position C2 of the connection pad 82 and the center position C3 of the via wiring 54Va is 20 μm. Since the diameter of the connection pad 82 is 100 μm, the lower end of the via wiring 54Va is located on the connection pad 82 and does not extend from the connection pad 82. Thus, the area of contact between the via wiring 54Va and the connection pads 82 will not be decreased. This limits the lowering of the connection reliability of the via wiring 54Va and the connection pad 82. Furthermore, because the component body 81 of the electronic component 80 will not be irradiated with laser beams that form the via holes 45X, the component body 81 receives no damage. This limits the lowering of the reliability.

The above embodiment has the advantages described below.

(1) The electronic component-incorporating substrate 1 includes the insulation layers 43 and 44 and the mount portion 60 including the first accommodation portion 71 in the upper surface 60a. The insulation layers 43 and 44 include the openings 43X and 44X exposing the upper surface peripheral portion 60b located around the first accommodation portion 71. The openings 43X and 44X form the second accommodation portion 72. The first accommodation portion 71 and the second accommodation portion 72 form the accommodation portion 70 accommodating the electronic component 80. The electronic component 80 includes the connection pads 82 arranged on the upper surface 81a and is adhered to the bottom surface 71a of the first accommodation portion 71 by the adhesive 85. The electronic component-incorporating substrate 1 further includes the insulation layer 45, which covers the electronic component 80, the connection pads 82, and the insulation layer 44 and fills the second accommodation portion 72, and the wiring layer 54 located on the upper surface of the insulation layer 45. The wiring layer 54 includes the via wirings 54Va extending through the insulation layer 45 and the wiring patterns 54Pa connected to the connection pads 82 of the electronic component 80 via the via wirings 54Va.

The electronic component 80 is accommodated in the accommodation portion 70, which includes the first accommodation portion 71 and the second accommodation portion 72, and is mounted on the mount portion 60 in the first accommodation portion 71. The first accommodation portion 71 restricts movement and rotation of the electronic component 80. This limits displacement of the electronic component 80. Such limitation on displacement of the electronic component 80 limits the lowering of the connection reliability of the connection pad 82 of the electronic component 80 with the via wiring 54Va.

(2) The size of the first accommodation portion 71 is set in accordance with the size of the electronic component 80 and the drilling position accuracy of laser drilling that forms the first accommodation portion 71. The size of the second accommodation portion 72 is set in accordance with the size of the electronic component 80, the position accuracy of a mount device/transport device that mounts the electronic component 80 (accuracy of mounting the electronic component 80), and the drilling position accuracy of a drilling device that forms the second accommodation portion 72. Thus, the electronic component 80 is accommodated in the first accommodation portion 71 through the second accommodation portion 72. The first accommodation portion 71 restricts movement and rotation of the electronic component 80. This limits displacement of the electronic component 80.

(3) The mount portion 60 includes the bottom surface 71a and the side surfaces 71b located around the bottom surface 71a. The side surfaces 71b are inclined so that the width of the first accommodation portion 71 increases from the bottom surface 71a toward the upper surface 60a (upper surface peripheral portion 60b) of the mount portion 60. When the electronic component 80 slides down along the side surfaces 71b, the electronic component 80 is readily mounted on the first accommodation portion 71.

(4) The upper surface peripheral portion 60b of the mount portion 60 located around the first accommodation portion 71 is a flat surface. Alternatively, the upper surface 60a (upper surface peripheral portion 60b) may be a smooth surface. When the upper surface 60a (upper surface peripheral portion 60b) is a flat surface or a smooth surface, movement of the electronic component 80 from the upper surface peripheral portion 60b to the first accommodation portion 71 is facilitated so that the electronic component 80 is readily mounted on the mount portion 60 in the first accommodation portion 71.

(5) The first accommodation portion 71 includes the recesses 71c extending outward from each corner (intersecting portions of adjacent side surfaces 71b) of the first accommodation portion 71 in plan view. The recesses 71c are each arcuate in plan view. Thus, when adhering the electronic component 80 to the first accommodation portion 71 with the adhesive 85, the first accommodation portion 71 and the recesses 71c allow an excess of the adhesive 85 to enter the recesses 71c. This limits displacement of the electronic component 80 caused by the adhesive 85.

It should be apparent to those skilled in the art that the foregoing embodiments may be implemented in many other specific forms without departing from the scope of this disclosure. Particularly, it should be understood that the foregoing embodiments may be implemented in the following forms.

In the modified examples described hereinafter, the same reference characters are given to those elements that are the same as the corresponding elements of the above embodiment. Such elements will not be described in detail.

In the above embodiment, a single electronic component 80 is incorporated in the electronic component-incorporating substrate 1. However, two or more electronic components may be incorporated. In this case, a first accommodation portion may be formed for each electronic component.

Figure 16A:
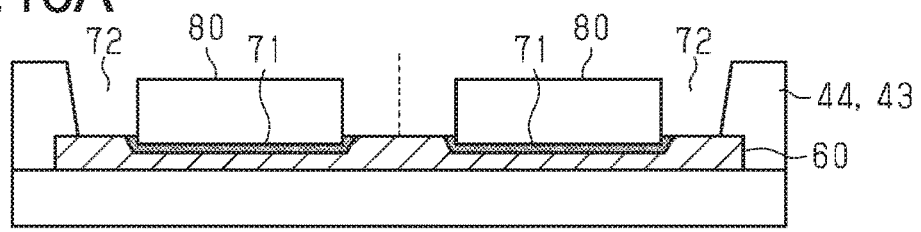
FIG. 16A is a partial enlarged cross-sectional view illustrating a modified example of an electronic component-incorporating substrate.
Figure 16B:
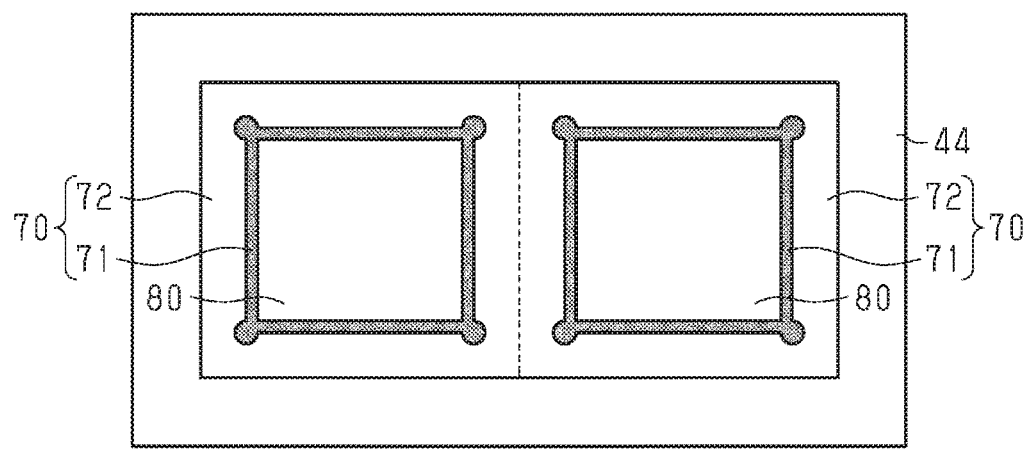
FIG. 16B is a plan view of the electronic component-incorporating substrate illustrated in FIG. 16A.

FIGS. 16A and 16B illustrate a portion of an electronic component-incorporating substrate that incorporates two electronic components 80. The mount portion 60 includes two first accommodation portions 71. The size of each first accommodation portion 71 is the same as that of the above embodiment. Two second accommodation portions 72 are continuously and integrally formed in the insulation layers 44 and 43. The two second accommodation portions 72 may be considered a single second accommodation portion 72. In the present modified example, the accommodation portion 70 is configured by the two first accommodation portions 71 and the two second accommodation portions 72. The broken lines illustrated in FIGS. 16A and 16B indicate the boundary between the two continuous second accommodation portions 72.

Figure 17A:
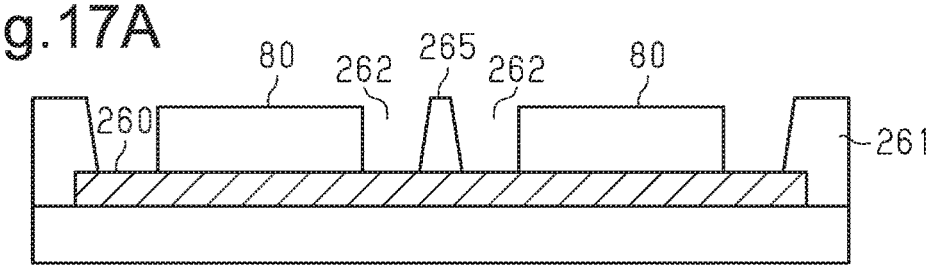
FIG. 17A is a partial enlarged cross-sectional view illustrating a comparative example of an electronic component-incorporating substrate.
Figure 17B:
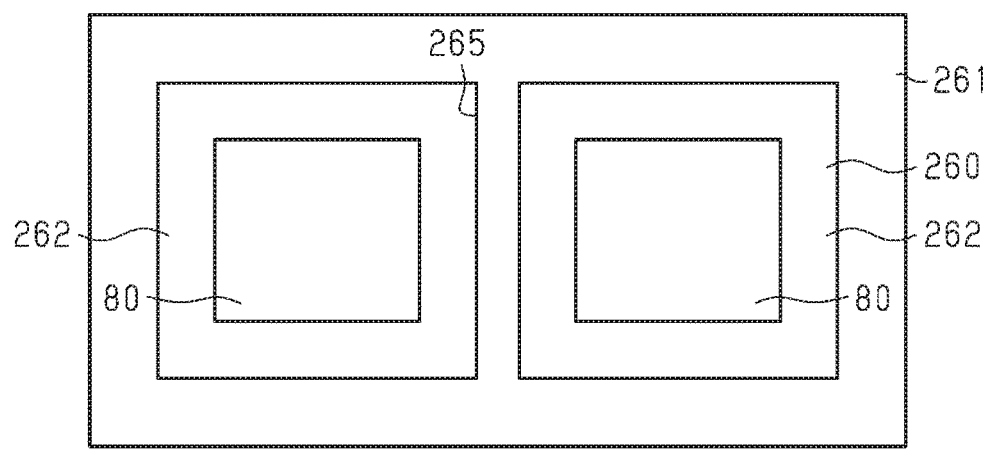
FIG. 17B is a plan view of the electronic component-incorporating substrate illustrated in FIG. 17A.

FIGS. 17A and 17B illustrate a portion of a comparative example of an electronic component-incorporating substrate. In this comparative example, a wall 265 is provided so that the accommodation portions 262 are independent from each other in order to prevent the electronic components 80 from contacting each other when the electronic components 80 are displaced. Thus, in this comparative example, the area needed for mounting the two electronic components 80 increases as compared to the example illustrated in FIGS. 16A and 16B. This may result in enlargement of the substrate. Thus, in the modified example illustrated in FIGS. 16A and 16B, the two second accommodation portions 72 corresponding to the two electronic components 80 are arranged adjacent to each other without a gap. Thus, an advantage of limiting enlargement of an electronic component-mounting substrate that incorporates two or more electronic components 80 is obtained in addition to the advantages of the above embodiment. The gap between the two electronic components 80 may be decreased as long as the electronic components 80 will not interfere with each other when mounted.

In the above embodiment, the electronic component-incorporating substrate 1 includes the core substrate 11. Instead, a coreless electronic component-incorporating substrate, which does not include a core substrate, may be used.

In the above embodiment, the number of wiring layers may be changed. The electronic component-incorporating substrate 1 may incorporate two or more semiconductor elements (electronic components). The electronic component-incorporating substrate 1 may incorporate an electronic component (e.g., inductor, resistor) other than a semiconductor element.

The embodiments and the modified examples described above may be combined as long as the combined modifications remain technically consistent with each other.

CLAUSES

This disclosure further encompasses the following embodiments.

1. A method for manufacturing an electronic component-incorporating substrate, the method including:
forming a mount portion from a metal;
forming a first insulation layer that covers an upper surface of the mount portion;
forming an opening in the first insulation layer by irradiating an upper surface of the first insulation layer with a laser beam, the opening partially exposing the upper surface of the mount portion;
forming a first accommodation portion recessed from the upper surface of the mount portion by irradiating the upper surface of the mount portion exposed in the opening of the first insulation layer with a laser beam, wherein the first accommodation portion is smaller than a second accommodation portion configured by the opening in the first insulation layer, and the upper surface of the mount portion remaining around the first accommodation portion is exposed through the second accommodation portion;
mounting an electronic component on the first accommodation portion, the electronic component including a connection pad arranged on an upper surface of the electronic component;
forming a second insulation layer that covers the first insulation layer, the electronic component, and the connection pad, wherein the second accommodation portion is filled with the second insulation layer; and
forming a wiring layer on an upper surface of the second insulation layer, wherein the wiring layer includes a via wiring that extends through the second insulation layer in a thickness-wise direction and a wiring pattern connected to the connection pad of the electronic component by the via wiring.

2. The method according to clause 1, wherein the forming a first accommodation portion includes forming a side surface of the first accommodation portion inclined so that the first accommodation portion has a width that increases from a bottom surface of the first accommodation portion to the upper surface of the mount portion.

3. The method according to clause 1 or 2, wherein the forming a first accommodation portion includes forming a recess in the first accommodation portion, the recess extending outward from a corner of the first accommodation portion in plan view.

4. The method according to any one of clauses 1 to 3, wherein
the first accommodation portion is sized in accordance with size of the electronic component and drilling position accuracy of laser drilling that irradiates the upper surface of the mount portion with the laser beam, and
the second accommodation portion is sized in accordance with size of the electronic component, accuracy of mounting the electronic component, and drilling position accuracy of laser drilling that irradiates the upper surface of the first insulation layer with the laser beam.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. An electronic component-incorporating substrate, comprising:
    a mount portion formed of a metal and including a first accommodation portion recessed from an upper surface of the mount portion;
    a first insulation layer including a second accommodation portion, the second accommodation portion being configured by an opening that exposes the first accommodation portion and partially exposes the upper surface of the mount portion located around the first accommodation portion;
    an electronic component mounted on the first accommodation portion and including a connection pad arranged on an upper surface of the electronic component;
    a second insulation layer covering, the first insulation layer, the electronic component, and the connection pad, wherein the second accommodation portion is filled with the second insulation layer; and
    a wiring layer formed on an upper surface of the second insulation layer, wherein the wiring layer includes a via wiring that extends through the second insulation layer in a thickness-wise direction and a wiring pattern connected to the connection pad of the electronic component by the via wiring,
    wherein the first accommodation portion includes a side surface that is inclined so that the first accommodation portion has a width that increases from a bottom surface of the first accommodation portion to the upper surface of the mount portion.

2. The electronic component-incorporating substrate according to claim 1, wherein
    The mount portion is rectangular in plan view,
    the first accommodation portion is rectangular in plan view, and
    the second accommodation portion partially exposes the upper surface of the mount portion located around the first accommodation portion as an upper surface peripheral portion.

3. The electronic component-incorporating substrate according to claim 1, wherein the first accommodation portion includes a recess extending outward from a corner of the first accommodation portion in plan view.

4. The electronic component-incorporating substrate according to claim 1, wherein
    a size of the first accommodation portion is set in accordance with a size of the electronic component and a drilling position accuracy of laser drilling that forms the first accommodation portion, and
    a size of the second accommodation portion is set in accordance with the size of the electronic component, an accuracy of mounting the electronic component, and a drilling position accuracy of laser drilling that forms the second accommodation portion.

5. The electronic component-incorporating substrate according to claim 1, wherein
    the first accommodation portion is one of a plurality of first accommodation portions recessed from the upper surface of the mount portion, and
    the second accommodation portion is a single second accommodation portion that exposes the plurality of first accommodation portions.

6. An electronic component-incorporating substrate, comprising:
    a mount portion formed of a metal and including a first accommodation portion recessed from an upper surface of the mount portion;
    a first insulation layer including a second accommodation portion, the second accommodation portion being configured by an opening that exposes the first accommodation portion and partially exposes the upper surface of the mount portion located around the first accommodation portion;
    an electronic component mounted on the first accommodation portion and including a connection pad arranged on an upper surface of the electronic component;
    a second insulation layer covering, the first insulation layer, the electronic component, and the connection pad, wherein the second accommodation portion is filled with the second insulation layer; and
    a wiring layer formed on an upper surface of the second insulation layer, wherein the wiring layer includes a via wiring that extends through the second insulation layer in a thickness-wise direction and a wiring pattern connected to the connection pad of the electronic component by the via wiring,
    wherein the first accommodation portion includes a recess extending outward from a corner of the first accommodation portion in plan view.

7. The electronic component-incorporating substrate according to claim 6, wherein the first accommodation portion includes a side surface that is inclined so that the first accommodation portion has a width that increases from a bottom surface of the first accommodation portion to the upper surface of the mount portion.

8. The electronic component-incorporating substrate according to claim 6, wherein
    The mount portion is rectangular in plan view,
    the first accommodation portion is rectangular in plan view, and
    the second accommodation portion partially exposes the upper surface of the mount portion located around the first accommodation portion as an upper surface peripheral portion.

9. The electronic component-incorporating substrate according to claim 6, wherein
    a size of the first accommodation portion is set in accordance with a size of the electronic component and a drilling position accuracy of laser drilling that forms the first accommodation portion, and
    a size of the second accommodation portion is set in accordance with the size of the electronic component, an accuracy of mounting the electronic component, and a drilling position accuracy of laser drilling that forms the second accommodation portion.

10. The electronic component-incorporating substrate according to claim 6, wherein
    the first accommodation portion is one of a plurality of first accommodation portions recessed from the upper surface of the mount portion, and the second accommodation portion is a single second accommodation portion that exposes the plurality of first accommodation portions.

* * * * *